(12) United States Patent
Wu

(10) Patent No.: US 10,840,324 B2
(45) Date of Patent: Nov. 17, 2020

(54) SEMICONDUCTOR STRUCTURE AND MANUFACTURING METHOD FOR THE SAME

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/114,885

(22) Filed: Aug. 28, 2018

(65) Prior Publication Data

US 2020/0075709 A1 Mar. 5, 2020

(51) Int. Cl.
| | |
|---|---|
| *H01L 49/02* | (2006.01) |
| *H01L 23/31* | (2006.01) |
| *H01L 23/522* | (2006.01) |
| *H01G 4/10* | (2006.01) |
| *H01L 21/768* | (2006.01) |
| *H01G 4/228* | (2006.01) |

(52) U.S. Cl.
CPC .............. *H01L 28/40* (2013.01); *H01G 4/10* (2013.01); *H01G 4/228* (2013.01); *H01L 21/76832* (2013.01); *H01L 23/3171* (2013.01); *H01L 23/5223* (2013.01); *H01L 23/5226* (2013.01)

(58) Field of Classification Search
CPC .............. H01L 28/40; H01L 23/5226; H01L 21/76832; H01L 23/5223; H01L 23/3171; H01G 4/228; H01G 4/10
See application file for complete search history.

(56) References Cited

U.S. PATENT DOCUMENTS

| | | | | |
|---|---|---|---|---|
| 6,483,142 B1 * | 11/2002 | Hsue | ................. | H01L 21/76807 257/306 |
| 9,472,502 B1 * | 10/2016 | Lee | .................... | H01L 21/28518 |
| 10,510,657 B2 * | 12/2019 | Yang | ................. | H01L 21/76802 |
| 2004/0251549 A1 * | 12/2004 | Huang | ............. | H01L 21/76804 257/758 |
| 2006/0097305 A1 * | 5/2006 | Lee | ..................... | C23C 16/0236 257/310 |
| 2008/0203525 A1 * | 8/2008 | Jang | .................... | H01L 23/5223 257/529 |
| 2010/0065944 A1 * | 3/2010 | Tu | ....................... | H01L 23/5223 257/532 |

(Continued)

*Primary Examiner* — Marcos D. Pizarro
*Assistant Examiner* — Sue Tang
(74) *Attorney, Agent, or Firm* — WPAT, P.C., Intellectual Property Attorneys; Anthony King

(57) ABSTRACT

The present disclosure provides a semiconductor structure, including a bottom terminal, a first middle terminal over the bottom terminal and separated from the bottom terminal by a high-k dielectric layer, a second middle terminal over the first middle terminal and separated from the first middle terminal by the high-k dielectric layer, a top terminal over the second middle terminal and separated from the second middle terminal by the high-k dielectric layer, a first via penetrating the bottom terminal and the second middle terminal, a second via penetrating the first middle terminal, a first passivation layer below the bottom terminal, and a second passivation layer over the top terminal.

20 Claims, 27 Drawing Sheets

(56) References Cited

U.S. PATENT DOCUMENTS

| | | | |
|---|---|---|---|
| 2013/0082351 A1* | 4/2013 | Chen | H01L 23/5223 257/532 |
| 2014/0159200 A1* | 6/2014 | Loke | H01L 23/5223 257/532 |
| 2016/0276426 A1* | 9/2016 | Yang | H01L 28/60 |
| 2019/0229053 A1* | 7/2019 | Hung | H01L 28/75 |

* cited by examiner

SEMICONDUCTOR STRUCTURE AND MANUFACTURING METHOD FOR THE SAME

BACKGROUND

Transistor devices of the integrated chips are configured to enable logical functionality for an integrated chip, such as capacitors, resistors, inductors, varactors, or other passive devices.

Capacitor is one of the transistor devices which can be used to store electric potential energy. Capacitors may also be used to block direct current while allowing alternating current to pass, smooth the output of power supplies, tune frequencies, or stabilize voltage and power flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
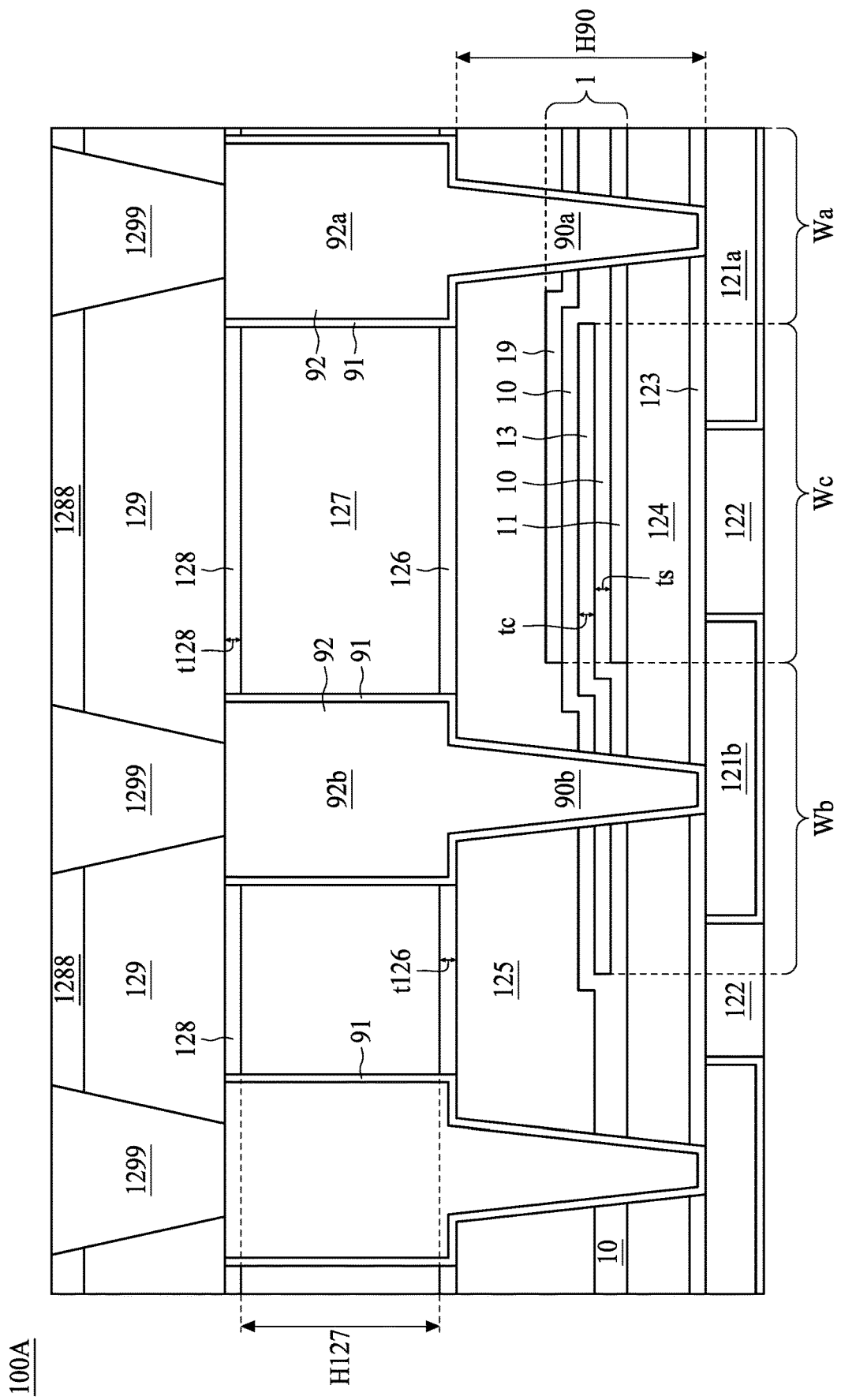
FIG. 1A to FIG. 1D are cross sectional views of semiconductor structures, according to some embodiments of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Metal-insulator-metal (MIM) capacitor is one of the types of capacitors. Metal-insulator-metal capacitors include at least two electrical conductors separated by dielectric layers. MIM capacitors may be used to store electric potential energy and/or mitigate noise.

Along the path of device miniaturization, conventional capacitors within a predetermined area may not provide enough storage of electric potential energy, therefore the performance of the MIM capacitors is entailed to be enhanced. Increasing the layers of terminals of the MIM capacitors can provide greater electric potential energy storage per unit area. However, during the process of forming the MIM capacitors, high aspect ratio redistribution vias may be formed to penetrate a plurality of terminals of the MIM capacitors, and subsequently conductive materials may be formed in the aforementioned vias. Therefore, during forming conductive materials inside the high aspect ratio redistribution vias (RV), the conductive materials may not be condensely filled inside the vias, thus inducing voids and thereby lowers the yield rate. When the material density in the RV is lower than a predetermined value, electric field-induced burn out may occur in the RV. Furthermore, low material density can lead to stress concentration and resulting in mechanical weakness on the capacitor structure. Present disclosure provides semiconductor structures and methods for fabricating thereof to enhance electric potential energy storage per unit area, prevent electric field-induced burn out, and improve mechanical strength to the capacitor structure.

Referring to FIG. 1A, FIG. 1A is a cross section of a semiconductor structure 100A, in accordance with some embodiments of the present disclosure. A first metal line 121a and a second metal line 121b are disposed in inter-metal dielectrics (IMDs) 122. The first metal line 121a and the second metal line 121b may be composed of substantially pure copper (for example, with a weight percentage of copper being greater than about 90 percent, or greater than about 95 percent) or copper alloys. The first metal line 121a and the second metal line 121b may be, or may not be, substantially free from aluminum. The IMDs 122 may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 122 may also be close to 3.8. In some embodiments, the k values of the low-k dielectric materials are lower than about 3.0, and may be lower than about 2.5. In some embodiments, the first metal line 121a and the second metal line 121b are top metal lines. The top surfaces of the first metal line 121a, the second metal line 121b, and the IMDs 122 may be coplanar.

The semiconductor structure 100A further includes a bottom etch stop layer 123 above the top surfaces of the first metal line 121a, the second metal line 121b, and the IMDs 122. A first passivation layer 124 is disposed above the bottom etch stop layer 123. The bottom etch stop layer 123 may include silicon nitride (SiN), or the like. In some embodiments, the first passivation layer 124 may be composed of glass, such as un-doped Silicate Glass (USG), or the like. In some other embodiments, the first passivation layer 124 may be composed of oxide layer, such as plasma enhanced deposited oxide, or the like. However, the material of the first passivation layer 124 may not be limited thereto; materials which can provide sufficient supporting strength and a low-roughness top surface are also under consideration. A capacitor stack 1 is disposed above the first passivation layer 124, herein the first passivation layer 124 may serve as a buffer layer providing a spacer to separate the capacitor stack 1 from the first metal line 121a and the second metal line 121b, reducing the potential of electrical shorting and mitigating the induction of parasitic capacitance.

The capacitor stack 1 includes a bottom terminal 11, a first middle terminal 13 above the bottom terminal 11, and a top terminal 19 above the first middle terminal 13. In some embodiments, a material of the bottom terminal 11, the first middle terminal 13, and the top terminal 19 may include conductive materials, such as titanium nitride (TiN), titanium (Ti), aluminum (Al), indium tin oxide (ITO), tungsten (W), tungsten nitride (WN), tantalum nitride (TaN), tantalum (Ta), rhenium trioxide ($ReO_3$), rhenium oxide ($ReO_2$), iridium oxide ($IrO_2$), ruthenium (Ru), osmium (Os), palladium (Pd), platinum (Pt), copper (Cu), molybdenum nitride (MoN), molybdenum (Mo), conductive metal, the combination thereof, or the like. For exemplary demonstration, each of a thickness tc of the bottom terminal 11, the first middle terminal 13, and the top terminal 19 may be around 400 Angstrom.

The bottom terminal 11 is disposed on a top surface of the first passivation layer 124 and above the first metal line 121a. In some embodiments, the bottom terminal 11 conforms to a portion of the top surface of the first passivation layer 124. Each of the bottom terminal 11, the first middle terminal 13, and the top terminal 19 includes at least a portion overlapping a capacitance region Wc of the capacitor stack 1, forming a capacitor between the bottom terminal 11 and the first middle terminal 13 within the capacitance region Wc, and another capacitance space between the first middle terminal 13 and the top terminal 19 within the capacitance region Wc.

The capacitor stack 1 further includes a high-k dielectric layer 10, herein the high-k dielectric layer 10 separates the bottom terminal 11 from the first middle terminal 13 and the first middle terminal 13 from the top terminal 19. The high-k dielectric layer 10 provides a separation is spacing between each of the terminals. For exemplary demonstration, the separation ts spacing between adjacent terminals within the capacitance region Wc may be around 60 Angstrom. In some embodiment, the high-k dielectric layer 10 may be a zirconium oxide ($ZrO_2$)—aluminum oxide ($Al_2O_3$)—zirconium oxide ($ZrO_2$) tri-layer. In some embodiments, each layer of the tri-layer in the high-k dielectric layer 10 has identical thickness, in the case of the separation ts being around 60 Angstrom, each layer of the tri-layer is around 20 Angstrom. In some other embodiments, the high-k dielectric layer 10 may include aluminum oxide ($Al_2O_3$), zirconium oxide ($ZrO_2$), silicon nitride ($Si_3N_4$), tantalum nitride ($Ta_2O_5$), titanium oxide ($TiO_2$), strontium titanate ($SrTiO_3$), yttrium oxide ($Y_2O_3$), lanthanum oxide ($La_2O_3$), hafnium oxide ($HfO_2$), a multi-layer structure of the combination thereof, or the like. In some embodiments, the first middle terminal 13 is surrounded by the high-k dielectric layer 10. The high-k dielectric layer 10 may further extend to cover a portion of the top surface of the first passivation layer 124.

The bottom terminal 11 further includes a portion within a first region Wa, herein the first region Wa is adjacent to the capacitance region Wc and above the first metal line 121a. The top terminal 19 may also include a portion within the first region Wa above at least a portion of the first metal line 121a. In contrast, the first middle terminal 13 include a portion within a second region Wb, wherein the second region Wb is adjacent to the capacitance region Wc and above at least a portion of the second metal line 121b. In some embodiments, the first middle terminal 13 and the top terminal 19 may be formed in plate shape. In some other embodiments, the first middle terminal 13 and the top terminal 19 may include portions leveling with various planes, for example a stepped shape. A second passivation layer 125 is formed above the high-k dielectric layer 10 and the capacitor stack 1. In some embodiments, a top surface of the second passivation layer 125 is substantially parallel to the top surface of the first passivation layer 124. In order to provide sufficient mechanical strength to support the structure, a thickness H90 measured from the top surface of the second passivation layer 125 to a top surface of the IMDs 122 is at least 12,500 Angstrom. A material of the second passivation layer 125 may be similar to the material of the first passivation layer 124, such as un-doped Silicate Glass (USG), plasma enhanced deposited oxide, or the like.

A first etch stop layer 126 is formed above the second passivation layer 125. The first etch stop layer 126 may include silicon nitride (SiN), or the like. A third passivation layer 127 is formed above the first etch stop layer 126. In some embodiments, the third passivation layer 127 may be composed of materials similar to the first passivation layer 124, such as un-doped Silicate Glass (USG), plasma enhanced deposited oxide, or the like. For exemplary demonstration, a thickness H127 of the third passivation layer 127 may be approximately 28,000 Angstrom. A second etch stop layer 128 is disposed above the third passivation layer 127, wherein the second etch stop layer 128 may include silicon nitride (SiN), or the like. For exemplary demonstration, a thickness t126 of the first etch stop layer 126 is approximately 750 Angstrom, while a thickness t128 of the second etch stop layer 128 is approximately 750 Angstrom.

A first via 90a, or a first redistribution via, is formed in the first region Wa, and being electrically connected to the first metal line 121a. A second via 90b, or a second redistribution via, is formed within the second area Wb and being electrically connected to the second metal line 121b. The first via 90a and the second via 90b may taper toward the first metal line 121a and the second metal line 121b respectively. Herein the bottom terminal 11 and the top terminal 19 are penetrated by the first via 90a, while the first middle terminal 13 is penetrated by the second via 90b. By separately connecting the bottom terminal 11 and the top terminal 19 to the first via 90a, and connecting the first middle terminal 13 to the second via 90b, different voltages can be applied separately thereby.

A first conductive post 92a is disposed above and being electrically connected to the first via 90a, while a second conductive post 92b is disposed above and being electrically connected to the second via 90b. In some embodiments, the first conductive post 92a and the second conductive post 92b may have substantially constant width. The width of the first conductive post 92a is greater than a width of a top surface of the first via 90a, while the width of the second conductive post 92b is greater than a width of a top surface of the second via 90b. A bottom surface of the first conductive post 92a and a bottom surface of the second conductive post 92b are within the first etch stop layer 126, or coplanar with a bottom surface or a top surface of the first etch stop layer 126. A top surface of the first conductive post 92a and a top surface of the second conductive post 92b are within the second etch stop layer 128, or coplanar with a top surface or a bottom surface of the second etch stop layer 128.

The first via 90a, the second via 90b, the first conductive post 92a, and the second conductive post 92b are composed with a conductive material 92, such as cobalt (Co). Cobalt is one of the conductive materials which can be filled in the vias or trenches with sufficient condensation; thence the induction of voids formed thereof may be reduced. The tapered shape of the first via 90a and the second via 90b may also improve the condensation of the conductive material 92. In some embodiments, a seed layer 91 is spacing between the conductive material 92 and each of a sidewall of the first via 90a, the second via 90b, the first conductive post 92a, and the second conductive post 92b. The seed layer 91 further covers a bottom surface of the first conductive post 92a connecting the sidewall of the first via 90a and the sidewall of the first conductive post 92a. The seed layer 91 also covers a bottom surface of the second conductive post 92b connecting the second via 90b and the sidewall of the second conductive post 92b. In some embodiments, the seed layer 91 may further spaces between the first via 93a and a top surface of the first metal line 121a; and also spaces between the second via 93b and the second metal line 121b. In some embodiments, the seed layer 91 includes tantalum nitride (TaN) and/or tantalum (Ta), or the like. The height of the first via 90a and the second via 90b are substantially identical to the aforementioned thickness H90 measured from the top surface of the second passivation layer 125 to a top surface of the IMDs 122.

A fourth passivation layer 129 is further disposed above the second etch stop layer 128. A material of the fourth passivation layer 129 may include un-doped Silicate Glass (USG), plasma enhanced deposited oxide, oxide layer, the combination thereof, or the like. For exemplary demonstration, the fourth passivation layer 129 may be composed of a USG layer proximal to the fourth passivation layer 129 and a plasma enhanced deposited oxide layer distal to the fourth passivation layer 129, wherein a thickness (not shown in FIG. 1A) of the USG layer is in a range from about 2,000 Angstrom to about 3,000 Angstrom, while a thickness (not shown in FIG. 1A) of the plasma enhanced deposited oxide layer is in a range from about 9,000 Angstrom to 10,000 Angstrom. The USG layer may provide a compact layer with sufficient condensation, while the plasma enhanced deposited oxide layer may provide a uniform upper surface. A third etch stop layer 1288 is disposed above the fourth passivation layer 129, and a metal contact 1299 is disposed above and being electrically connected to each of the first conductive post 92a, and the second conductive post 92b. A top surface of the metal contact 1299 is coplanar with the third etch stop layer 1288.

Figure 1B:
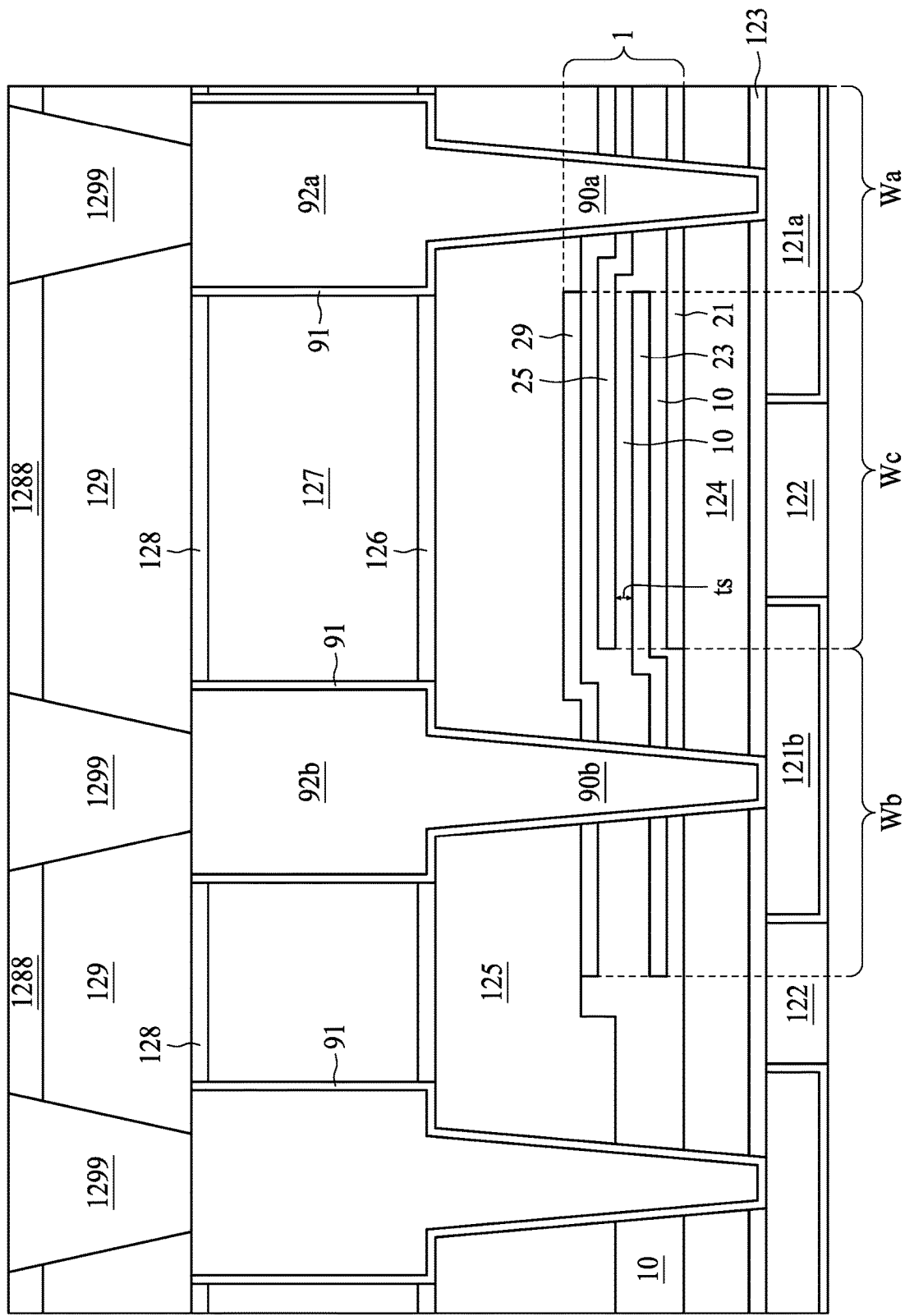

Referring to FIG. 1B, FIG. 1B is a cross section of a semiconductor structure 100B, in accordance with some embodiments of the present disclosure. Note that hereinafter elements in FIG. 1B to FIG. 1D being the same as or similar to aforesaid counterparts in FIG. 1A are denoted by the same reference numerals, as duplicated explanations are omitted. In some embodiments, the capacitor stack 1 of the semiconductor structure 100B includes a bottom terminal 21, a first middle terminal 23 above the bottom terminal 21, a second middle terminal 25 above the first middle terminal 23, and a top terminal 29 above the second middle terminal 25. The thickness and the material of the bottom terminal 21, the first middle terminal 23, the second middle terminal 25, and the top terminal 29 may be similar to the bottom terminal 11, the first middle terminal 13, and the top terminal 19 previously discussed in FIG. 1A.

The bottom terminal 21 is disposed on the top surface of the first passivation layer 124 and above the first metal line 121a. In some embodiments, the bottom terminal 21 conforms to a portion of the top surface of the first passivation layer 124. Each of the bottom terminal 21, the first middle terminal 23, the second middle terminal 25, and the top terminal 29 includes at least a portion overlapping a capacitance region Wc of the capacitor stack 1, forming a capacitor space between each of the adjacent terminals within the capacitance region Wc. Each of the adjacent terminals within the capacitance region Wc are separated by the high-k dielectric layer 10, wherein the material of the high-k dielectric layer 10 and the thickness ts between each of the terminals within the capacitance region Wc are similar to the aforesaid counterparts in FIG. 1A.

Figure 1C:
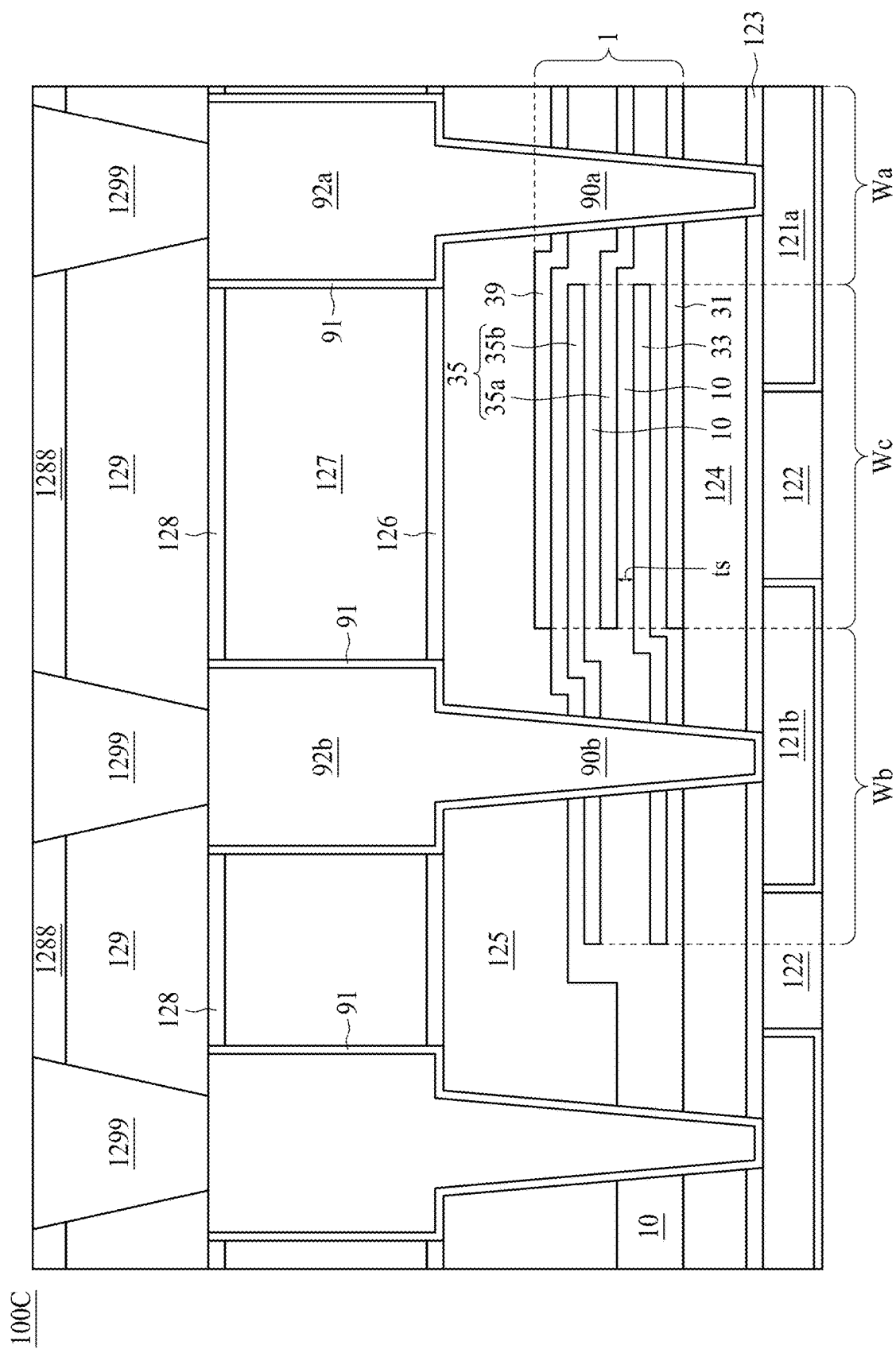

Referring to FIG. 1C, FIG. 1C is a cross section of a semiconductor structure 100C, in accordance with some embodiments of the present disclosure. In some embodiments, the capacitor stack 1 of the semiconductor structure 100C includes a bottom terminal 31, a first middle terminal 33 above the bottom terminal 31, a plurality of the second middle terminal 35 (for example, terminals 35a and 35b) above the first middle terminal 33, and a top terminal 39 above the plurality of the second middle terminal 35. Herein the number of the second middle terminal 35 between the first middle terminal 33 and the top terminal 39 is even, such as 2, 4, 6, etc. The thickness and the material of the bottom terminal 31, the first middle terminal 33, the plurality of the second middle terminal 35, and the top terminal 39 may be similar to the bottom terminal 11, the first middle terminal 13, and the top terminal 19 previously discussed in FIG. 1A.

The bottom terminal 31 is disposed on the top surface of the first passivation layer 124 and above the first metal line 121a. In some embodiments, the bottom terminal 31 conforms to a portion of the top surface of the first passivation layer 124. Each of the bottom terminal 31, the first middle terminal 33, the plurality of the second middle terminal 35 (for example, terminals 35a and 35b), and the top terminal 39 includes at least a portion overlapping a capacitance region We of the capacitor stack 1, forming a capacitor space between each of the adjacent terminals within the capacitance region Wc. Each of the adjacent terminals within the capacitance region We are separated by the high-k dielectric layer 10, wherein the material of the high-k dielectric layer 10 and the thickness is between each of the terminals within the capacitance region We are similar to the aforesaid counterparts in FIG. 1A.

It is noteworthy that the bottom terminal 31, the top terminal 39, and half of the plurality of the second middle terminal 35 are penetrated by the first via 90a, while the first middle terminal 33 and half of the plurality of the second middle terminal 35 are penetrated by the second via 90b. By separately connecting the adjacent terminals to different vias, different voltages can be applied separately thereby.

Figure 1D:
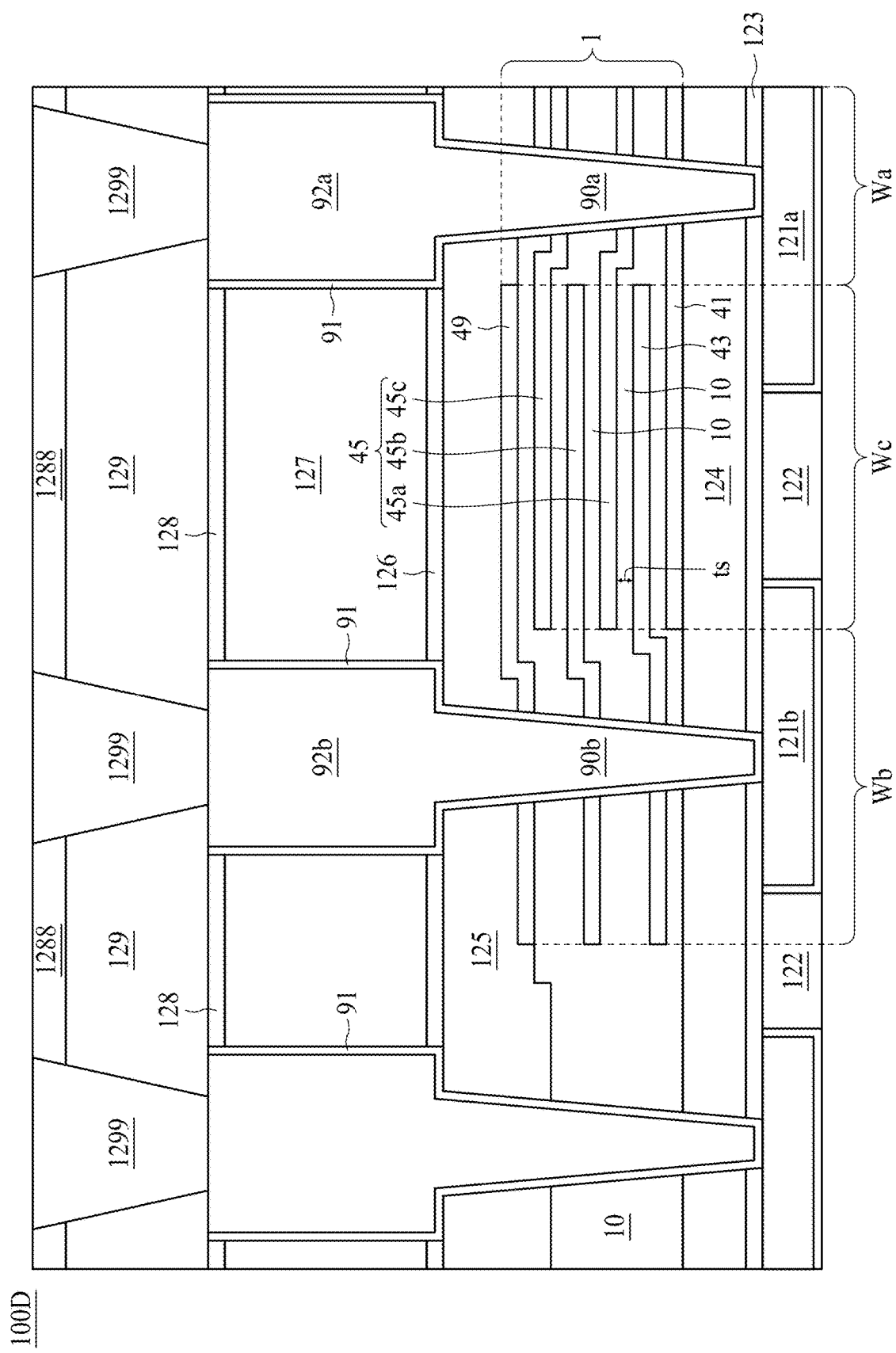

Referring to FIG. 1D, FIG. 1D is a cross section of a semiconductor structure 100D, in accordance with some embodiments of the present disclosure. In some embodiments, the capacitor stack 1 of the semiconductor structure 100D includes a bottom terminal 41, a first middle terminal 43 above the bottom terminal 41, a plurality of the second middle terminal 45 (for example, terminals 45a, 45b, and 45c) above the first middle terminal 43, and a top terminal 49 above the plurality of the second middle terminal 45. Herein the number of the second middle terminal 45 between the first middle terminal 43 and the top terminal 49 is odd, such as 1, 3, 5, etc. The thickness and the material of the bottom terminal 41, the first middle terminal 43, the plurality of the second middle terminal 45, and the top terminal 49 may be similar to the bottom terminal 11, the first middle terminal 13, and the top terminal 19 previously discussed in FIG. 1A.

The bottom terminal 41 is disposed on the top surface of the first passivation layer 124 and above the first metal line 121a. In some embodiments, the bottom terminal 41 conforms to a portion of the top surface of the first passivation layer 124. Each of the bottom terminal 41, the first middle terminal 43, the plurality of the second middle terminal 45 (for example, terminals 45a, 45b, and 45c), and the top terminal 49 includes at least a portion overlapping a capacitance region We of the capacitor stack 1, forming a capacitor space between each of the adjacent terminals within the capacitance region Wc. Each of the adjacent terminals within the capacitance region We are separated by the high-k dielectric layer 10, wherein the material of the high-k dielectric layer 10 and the thickness is between each of the terminals within the capacitance region We are similar to the aforesaid counterparts in FIG. 1A.

It is noteworthy that the bottom terminal 41 and a first number of the second middle terminal 45 are penetrated by the first via 90a, while the first middle terminal 43, the top terminal 49, and a second number of the second middle terminal 45 are penetrated by the second via 90b, wherein the first number is greater than the second number by 1. By separately connecting the adjacent terminals to different vias, different voltages can be applied separately thereby.

Figure 2A:
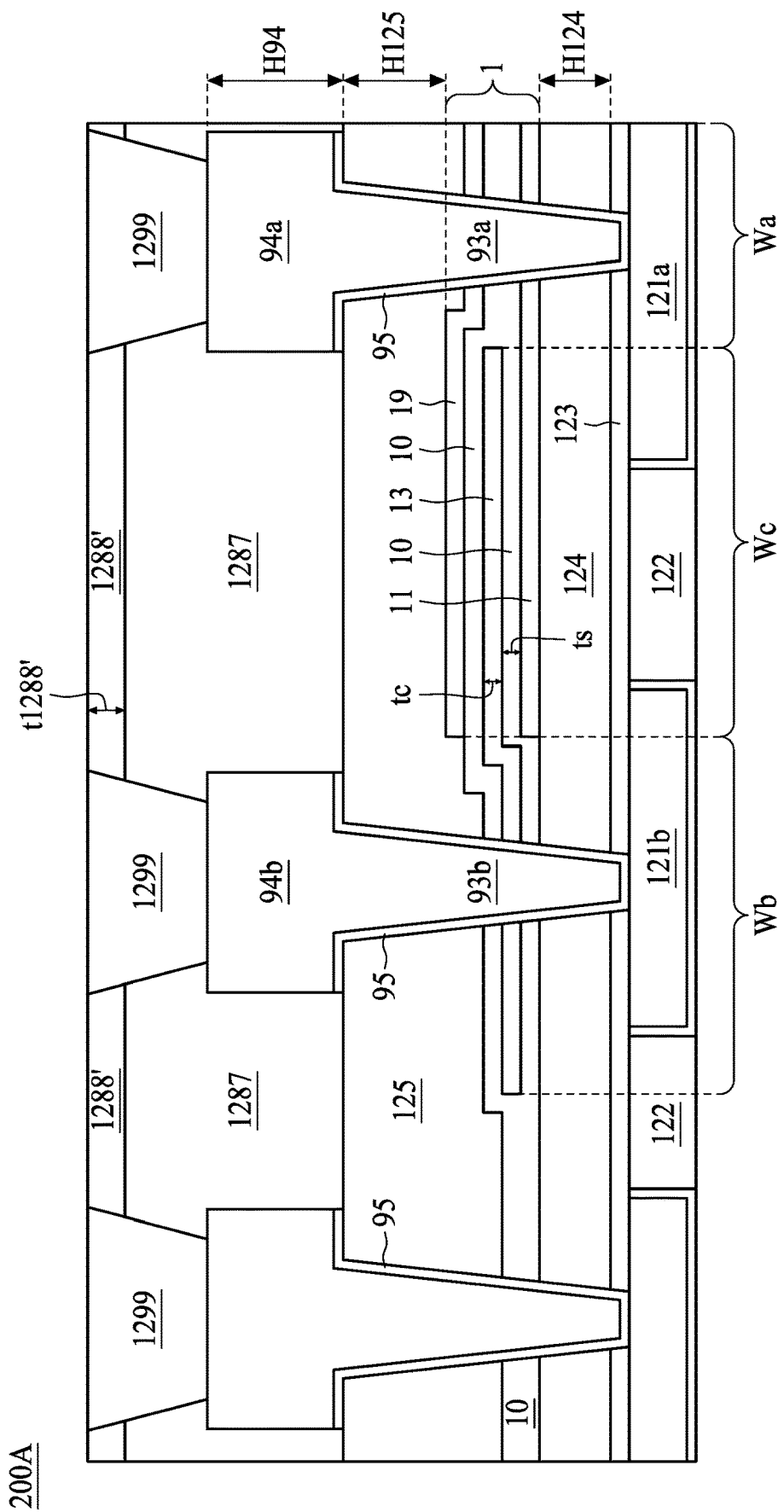
FIG. 2A to FIG. 2D are cross sectional views of semiconductor structures, according to some embodiments of present disclosure.

Referring to FIG. 2A, FIG. 2A is a cross section of a semiconductor structure 200A, in accordance with some embodiments of the present disclosure. Note that hereinafter elements in FIG. 2A being the same as or similar to the aforesaid counterparts in FIG. 1A are denoted by the same reference numerals, as duplicated explanations are omitted.

The first metal line 121a and the second metal line 121b are formed in inter-metal dielectrics (IMDs) 122. The IMDs 122 may be formed of oxides such as un-doped Silicate Glass (USG), low-k dielectric materials, or the like. In some embodiments, the first metal line 121a and the second metal line 121b are top metal lines. A chemical mechanical planarization operation may further be performed on top surfaces of the first metal line 121a, the second metal line 121b, and the IMDs 122. The bottom etch stop layer 123 above the top surfaces of the first metal line 121a, the second metal line 121b, and the IMDs 122. The first passivation layer 124 is disposed above the bottom etch stop layer 123. In some embodiments, the first passivation layer 124 may be composed of glass, such as un-doped Silicate Glass (USG), or the like. In some other embodiments, the first passivation layer 124 may be composed of oxide layer, such as plasma enhanced deposited oxide, or the like. A thickness T124 of the first passivation layer 124 is in a range from about 2,700 Angstrom to about 3,300 Angstrom, as the criticality thereof will be discussed subsequently.

A capacitor stack 1 is disposed above the first passivation layer 124, herein the first passivation layer 124 may serve as a buffer layer providing a spacing to separate the capacitor stack 1 from the first metal line 121a and the second metal line 121b, reducing the potential of electrical shorting and mitigating the induction of parasitic capacitance. The capacitor stack 1 includes the bottom terminal 11, the first middle terminal 13 above the bottom terminal 11, and the top terminal 19 above the first middle terminal 13, each similar to the counterparts discussed in FIG. 1A.

The bottom terminal 11 is disposed on the top surface of the first passivation layer 124 and above the first metal line 121a. In some embodiments, the bottom terminal 11 conforms to a portion of the top surface of the first passivation layer 124. Each of the bottom terminal 11, the first middle terminal 13, and the top terminal 19 includes at least a portion overlapping a capacitance region We of the capacitor stack 1, forming a capacitor between the bottom terminal 11 and the first middle terminal 13 within the capacitance region Wc, and another capacitance space between the first middle terminal 13 and the top terminal 19 within the capacitance region Wc.

The capacitor stack 1 further includes a high-k dielectric layer 10, herein the high-k dielectric layer 10 separates the bottom terminal 11 from the first middle terminal 13 and the first middle terminal 13 from the top terminal 19. The high-k dielectric layer 10 provides a separation ts spacing between each of the terminals. For exemplary demonstration, the separation ts spacing between adjacent terminals within the capacitance region Wc may be around 60 Angstrom. In some embodiments, the first middle terminal 13 is surrounded by the high-k dielectric layer 10. The high-k dielectric layer 10 may further extend to cover a portion of the top surface of the first passivation layer 124. The bottom terminal 11 further includes a portion within the first region Wa, herein the first region Wa is adjacent to the capacitance region Wc and above the first metal line 121a. The top terminal 19 may also include a portion within the first region Wa above at least a portion of the first metal line 121a. In contrast, the first middle terminal 13 include a portion within the second region Wb, wherein the second region Wb is adjacent to the capacitance region Wc and above at least a portion of the second metal line 121b.

The second passivation layer 125 is disposed above the high-k dielectric layer 10 and the capacitor stack 1. In some embodiments, a top surface of the second passivation layer 125 is substantially parallel to the top surface of the first passivation layer 124. In order to provide sufficient mechanical strength to support the structure, a thickness H125 measured from the top surface of the second passivation layer 125 to a top surface of the top terminal 19 is at least 7,000 Angstrom, as will be discussed subsequently. A material of the second passivation layer 125 may be similar to the material of the first passivation layer 124, such as un-doped Silicate Glass (USG), plasma enhanced deposited oxide, or the like.

A first via 93a is formed in the first region Wa, and being electrically connected to the first metal line 121a. A second via 93b is formed within the second area Wb and being electrically connected to the second metal line 121b. The first via 93a and the second via 93b may penetrates through the second passivation layer 125 and taper toward the first metal line 121a and the second metal line 121b respectively. Herein the second passivation layer 125, the bottom terminal 11 and the top terminal 19 are penetrated by the first via 93a, while the first middle terminal 13 and the second passivation layer 125 are penetrated by the second via 93b. By separately connecting the bottom terminal 11 and the top terminal 19 to the first via 93a, and connecting the first middle terminal 13 to the second via 93b, different voltages can be applied separately thereby.

A first conductive post 94a is disposed above and being electrically connected to the first via 93a, while a second conductive post 94b is disposed above and being electrically connected to the second via 93b. In some embodiments, the first conductive post 94a and the second conductive post 94b may have substantially constant width. The width of the first conductive post 94a is greater than a width of a top surface of the first via 93a, while the width of the second conductive post 94b is greater than a width of a top surface of the second via 93b. The first via 93a and the second via 93b are filled with a conductive material 94, while the first conductive post 94a and the second conductive post 94b are composed of the same conductive material 94. In some embodiments, the conductive material 94 is copper aluminum (AlCu), which may provide sufficient conductivity with lower cost.

The first conductive post 94a and the second conductive post 94b each has a height around 28,000 Angstrom. Since the weight of the first conductive post 94a, the second conductive post 94b, and external forces may apply stress on the capacitor stack 1, further inducing deformation, cracks, or defects. In order to provide sufficient mechanical strength to support the structure, the thickness H125 measured from the top surface of the second passivation layer 125 to a top surface of the top terminal 19 is at least 7,000 Angstrom. However, voids may be induced while forming the conductive material 94 in the first via 93a and the second via 93b due to the high aspect ratio thereof. Thence, a thickness H124 of the first passivation layer 124 is in a range from about 2,700 Angstrom to about 3,300 Angstrom, which can provide sufficient mechanical strength while reducing the aspect ratio of the first via 93a and the second via 93b, further mitigating induction of voids. In addition, the tapered shape of the first via 93a and the second via 93b may also improve the condensation of the conductive material 94.

In some embodiments, the semiconductor structure 200A further include an adhesion layer 95 spacing between the conductive material 94 and a sidewall of the first via 93a or a sidewall of the second via 94a. The adhesion layer 95 may further spacing between the second passivation layer 125 and a portion of the first conductive post 94a or a portion of the second conductive post 94b. In some embodiments, the adhesion layer 95 further spaces between the first via 93a and a top surface of the first metal line 121a; and also spaces between the second via 93b and the second metal line 121b.

An upper passivation layer 1287 is disposed above the second passivation layer 125, surrounding the first conductive post 94a, the second conductive post 94b, and metal contacts 1299 above each of the first conductive post 94a and the second conductive post 94b. In some embodiments, the upper passivation layer 1287 may be composed of materials similar to the first passivation layer 124, such as un-doped Silicate Glass (USG), plasma enhanced deposited oxide, the combination thereof, or the like. An upper etch stop layer 1288' is disposed above the upper passivation layer 1287, wherein the upper etch stop layer 1288' may include silicon nitride (SiN), or the like. A top surface of the upper etch stop layer 1288' is coplanar with a top surface of the metal contact 1299. For exemplary demonstration, a thickness t1288' of the upper etch stop layer 1288' is approximately 7,000 Angstrom.

Figure 2B:
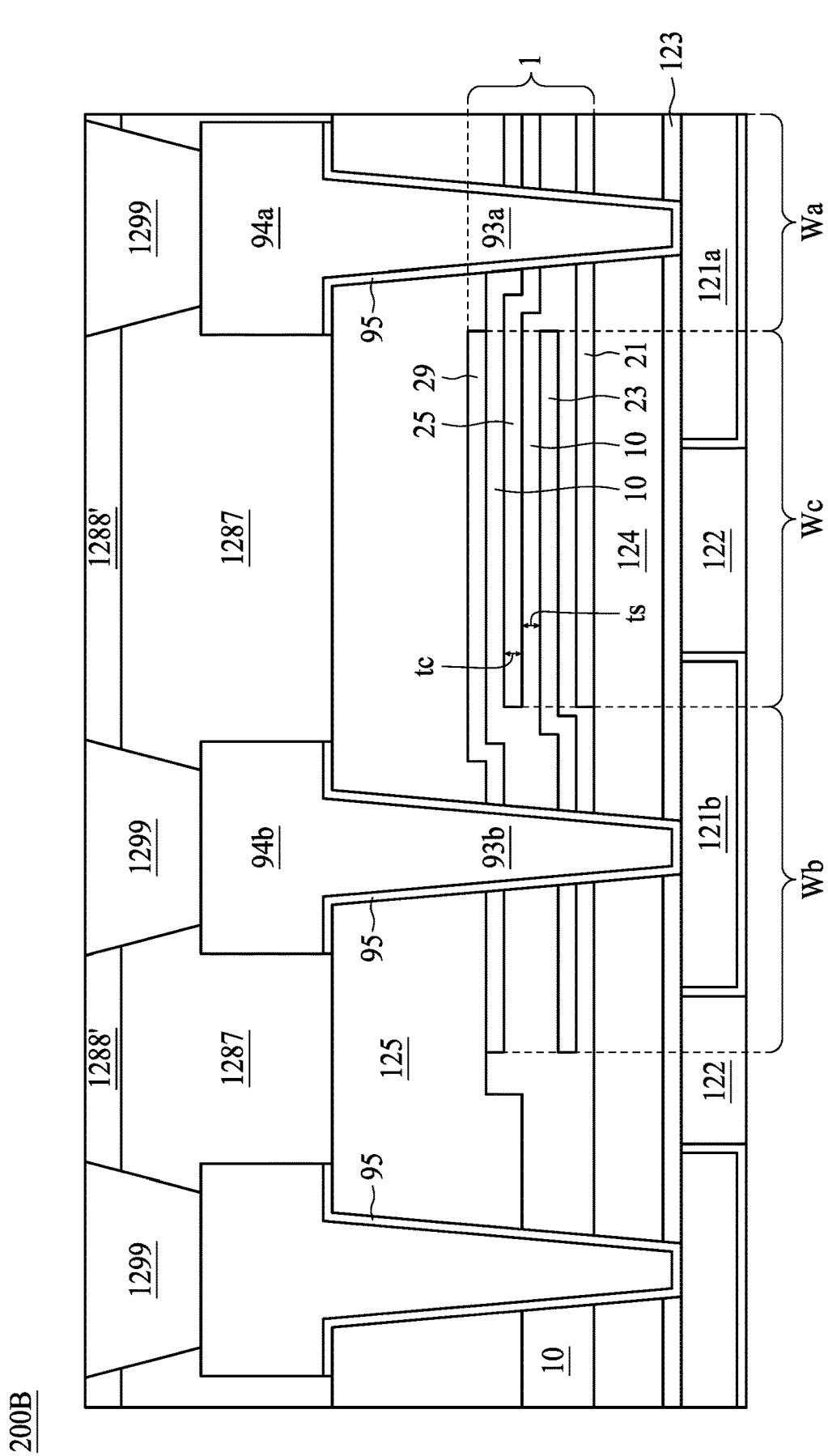

Referring to FIG. 2B, FIG. 2B is a cross section of a semiconductor structure 200B, in accordance with some embodiments of the present disclosure. Note that hereinafter elements in FIG. 2B to FIG. 2D being the same as or similar to aforesaid counterparts in FIG. 2A are denoted by the same reference numerals, as duplicated explanations are omitted. The capacitor stack 1 of the semiconductor structure 200B is similar to the capacitor stack 1 discussed in FIG. 1B, which includes the bottom terminal 21, the first middle terminal 23 above the bottom terminal 21, the second middle terminal 25 above the first middle terminal 23, and the top terminal 29 above the second middle terminal 25.

Figure 2C:
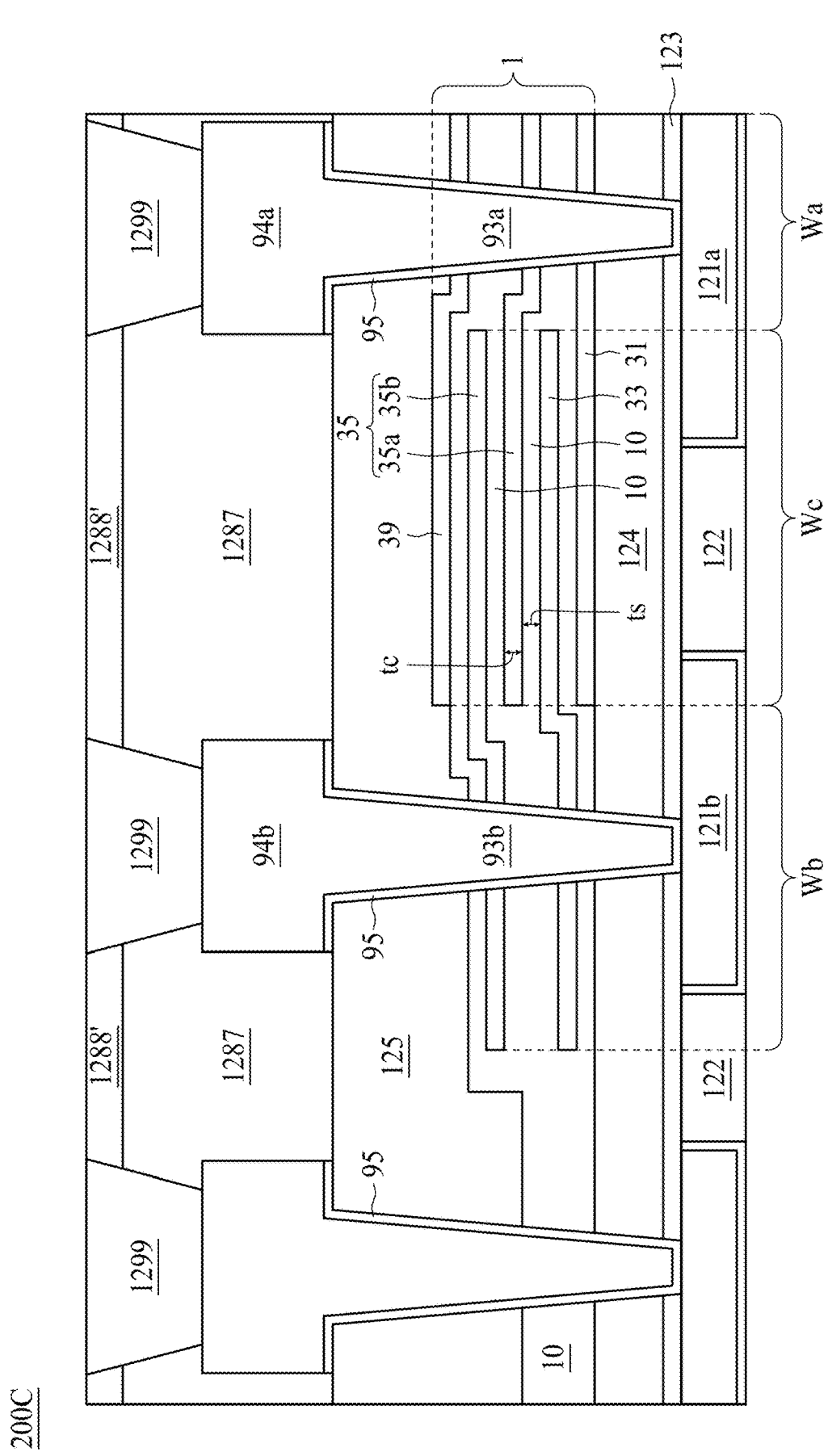

Referring to FIG. 2C, FIG. 2C is a cross section of a semiconductor structure 200C, in accordance with some embodiments of the present disclosure. The capacitor stack 1 of the semiconductor structure 200C is similar to the capacitor stack 1 discussed in FIG. 1C, which includes the bottom terminal 31, the first middle terminal 33 above the bottom terminal 31, the plurality of the second middle terminal 35 (for example, terminals 35a and 35b) above the first middle terminal 33, and the top terminal 39 above the plurality of the second middle terminal 35. Herein the number of the second middle terminal 35 between the first middle terminal 33 and the top terminal 39 is even, such as 2, 4, 6, etc.

Figure 2D:
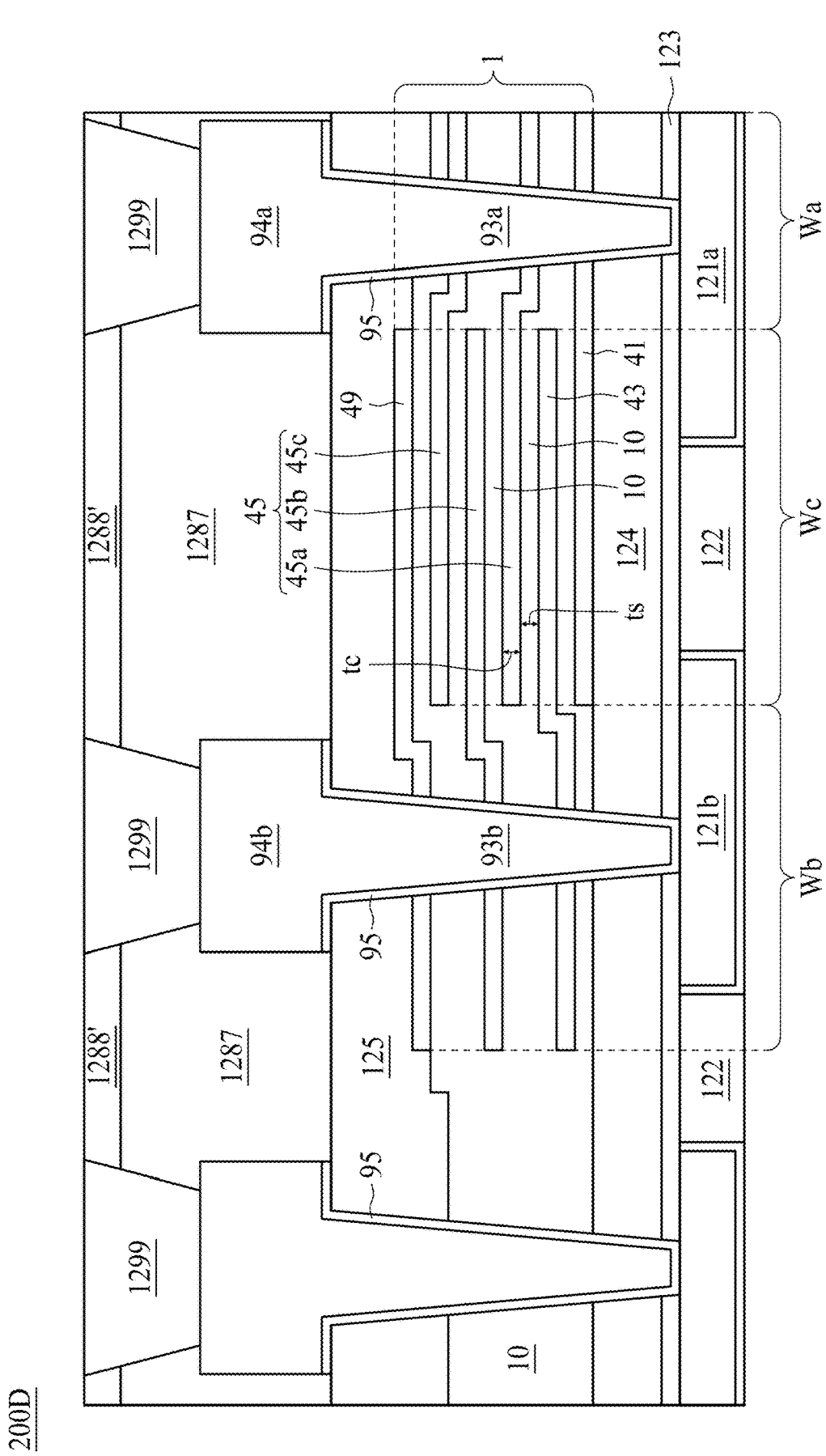

Referring to FIG. 2D, FIG. 2D is a cross section of a semiconductor structure 200D, in accordance with some embodiments of the present disclosure. The capacitor stack 1 of the semiconductor structure 200D is similar to the capacitor stack 1 discussed in FIG. 1D, which includes a bottom terminal 41, a first middle terminal 43 above the bottom terminal 41, a plurality of the second middle terminal 45 (for example, terminals 45a, 45b, and 45c) above the first middle terminal 43, and a top terminal 49 above the plurality of the second middle terminal 45. Herein the number of the second middle terminal 45 between the first middle terminal 43 and the top terminal 49 is odd, such as 1, 3, 5, etc.

Figure 3:
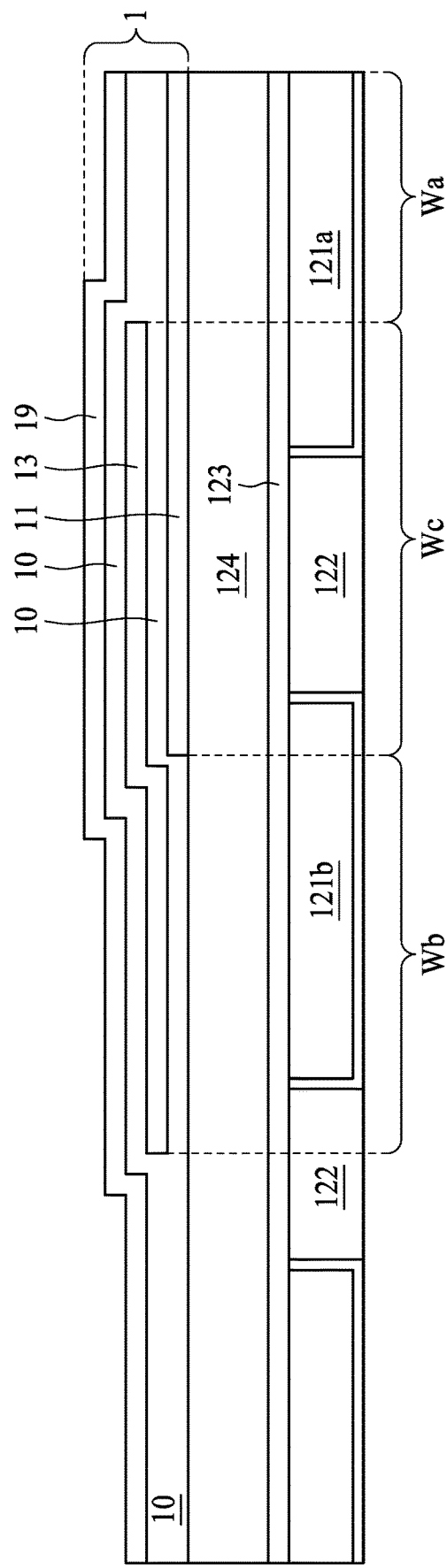
FIG. 3 is a cross sectional view of a semiconductor structure during an intermediate stage of its manufacturing process, according to some embodiments of present disclosure.

FIG. 3 is a cross section of a semiconductor structure during an intermediate stage of manufacturing operations, in accordance with some embodiments of the present disclosure. The first metal line 121a and the second metal line 121b are formed in inter-metal dielectrics (IMDs) 122. The first metal line 121a and the second metal line 121b may be formed by a variety of techniques, e.g., single and/or dual damascene processes, electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The IMDs 122 may be formed of oxides such as un-doped Silicate Glass (USG), Fluorinated Silicate Glass (FSG), low-k dielectric materials, or the like. A planarization operation, such as chemical mechanical planarization (CMP) operation, is performed on the top surfaces of the first metal line 121a, the second metal line 121b and the IMDs 122.

The bottom etch stop layer 123 is formed above the first metal line 121a, the second metal line 121b and the IMDs 122. The first passivation layer 124 is disposed above the bottom etch stop layer 123. The first passivation layer 124 may be composed of glass, such as un-doped Silicate Glass (USG), or the like. In some other embodiments, the first passivation layer 124 may be composed of oxide layer, such as plasma enhanced deposited oxide, or the like. In some embodiments, the first passivation layer 124 may be may be formed by spin coating, deposition, plasma enhanced deposition, or the like.

The bottom terminal 11 is disposed above the first passivation layer 124, herein the bottom terminal 11 covers at least a portion of the first region Wa and at least a portion of the capacitance region Wc, as at least a portion of a top surface of the first passivation layer 124 within the second region Wb is exposed from the bottom terminal 11. The top surface of the first passivation layer 124 exposing for the bottom terminal 11 is covered by the high-k dielectric layer 10. In some embodiments, the forming of the high-k dielectric layer 10 may include laminating $ZrO_2$—$Al_2O_3$—$ZrO_2$ tri-layer. The first middle terminal 13 has a portion within the second region Wb and a portion within the capacitance region Wc, herein the high-k dielectric layer 10 is formed above the bottom terminal 11, spacing between the first middle terminal 13 and the bottom terminal 11. The high-k dielectric layer 10 is further formed above the first region Wa, the second region Wb, and the capacitance region Wc, covering the first middle terminal 13. The top terminal 19 is further formed above the high-k dielectric layer 10 over the first region Wa, the second region Wb, and the capacitance region Wc.

Figure 4A:
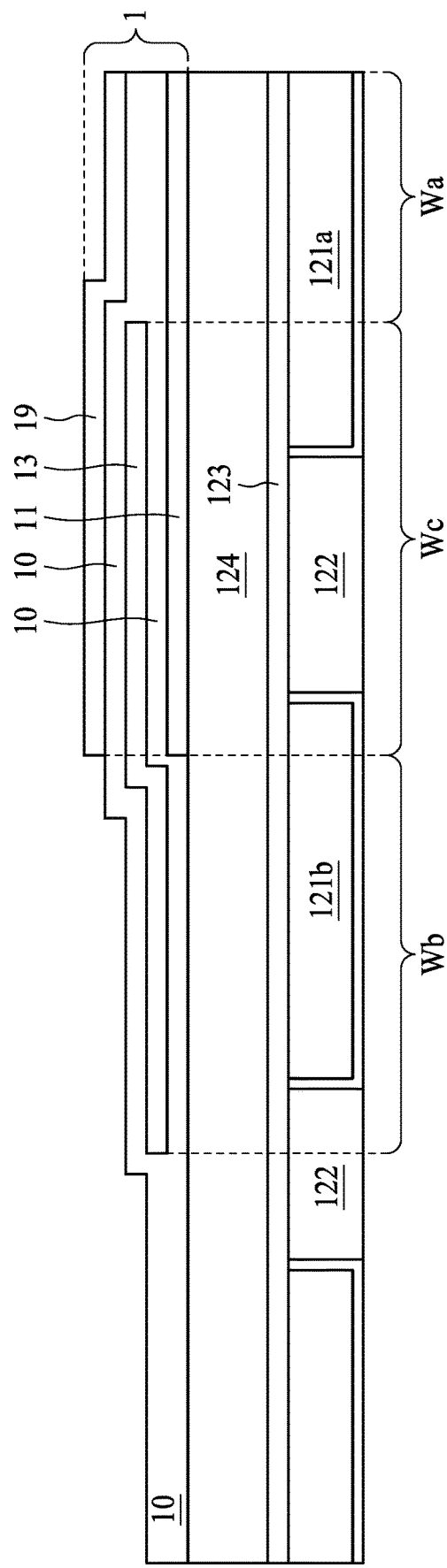
FIG. 4A to FIG. 4D are cross sectional views of semiconductor structures during an intermediate stage of its manufacturing process, according to some embodiments of present disclosure.
Figure 4B:
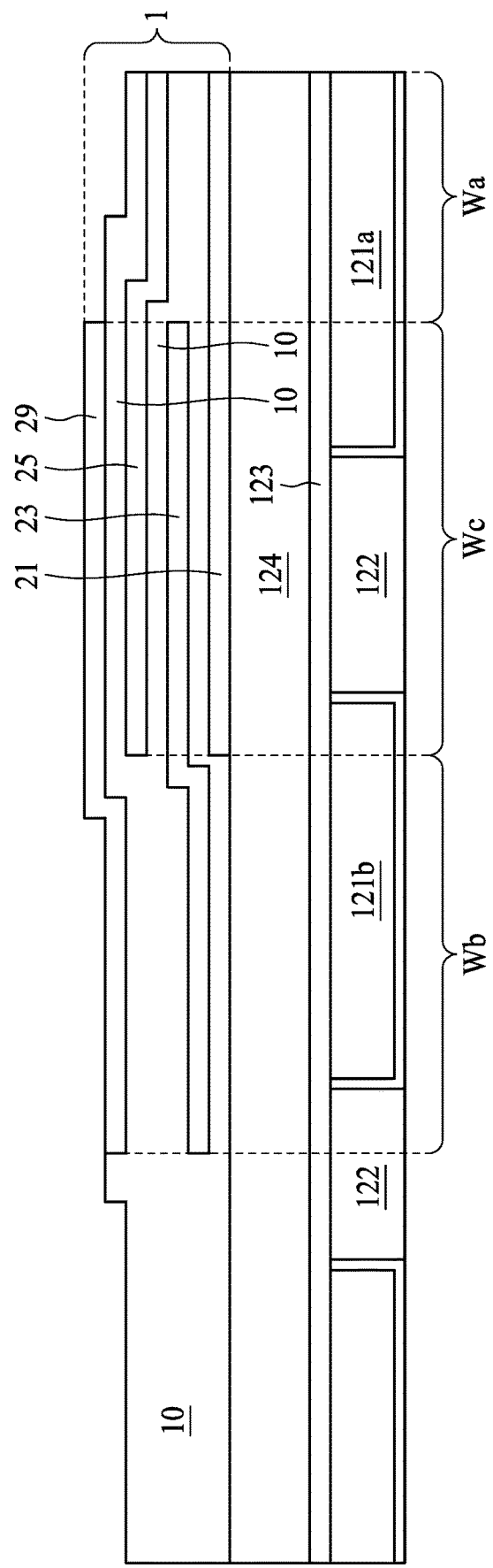
Figure 4C:
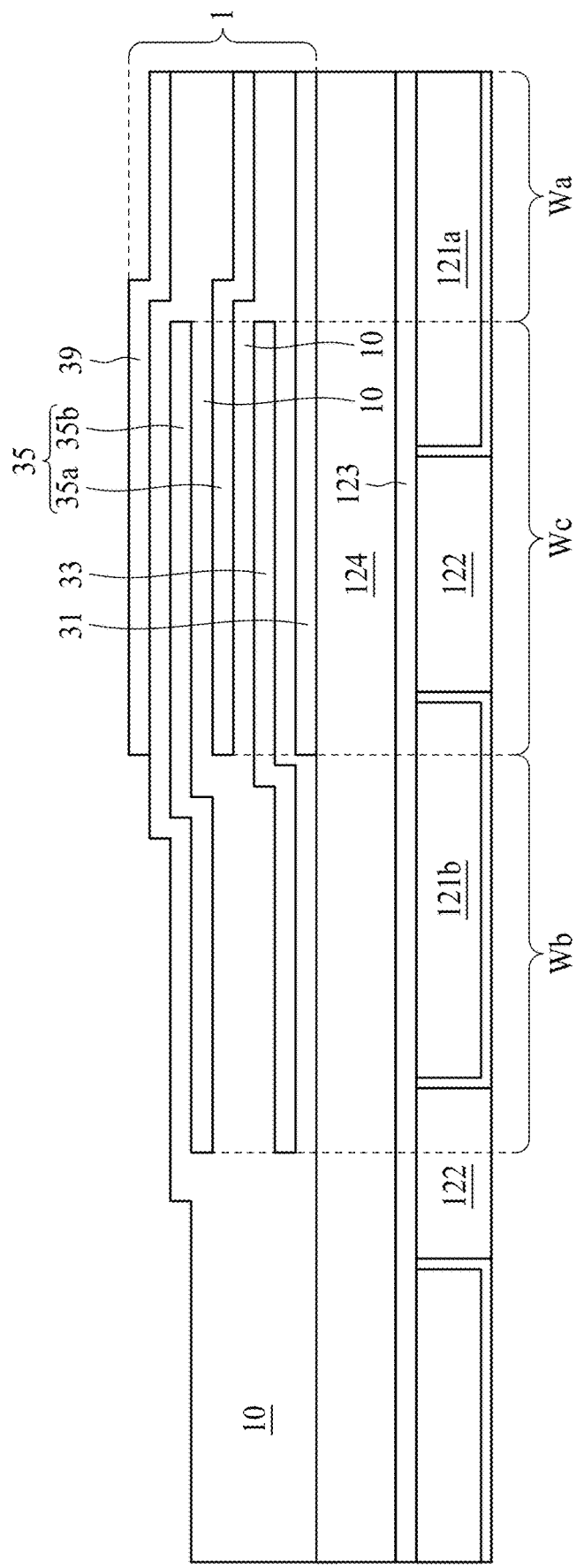
Figure 4D:
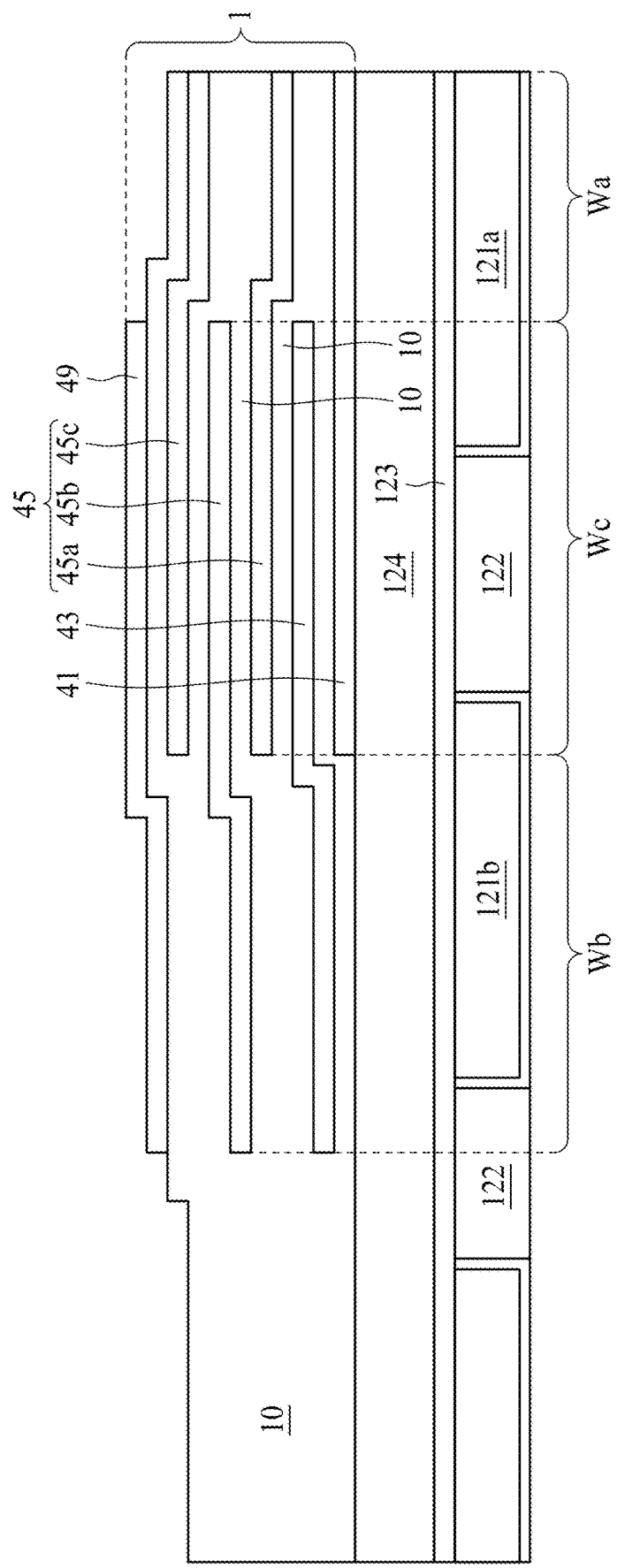

FIG. 4A to FIG. 4D are cross sections of a semiconductor structure during intermediate stages of manufacturing operations, in accordance with some embodiments of the present disclosure. Referring to FIG. 4A, at least a portion of the top terminal 19 within the second region Wb is removed. The remained portion of the top terminal 19, first middle terminal 13, and the bottom terminal 11 may compose the terminals of the capacitor stack 1. In some embodiments, the capacitor stack 1 can be substituted by the capacitor stacks 1 introduced in FIG. 1B to FIG. 1D, as shown in FIG. 4B to FIG. 4D respectively, as similar operation can be performed repeatedly to form a predetermined numbers of terminals. It is noteworthy that the removed portion of the top terminal 19 subsequent to the forming thereof is determined by the total terminals of the capacitor stack 1. If the capacitor stack 1 includes an odd number of terminals (for example FIG. 4A and FIG. 4C), at least a portion of the top terminal within the second region Wb is removed. If the capacitor stack 1 includes an even number of terminals (for example FIG. 4B and FIG. 4D), at least a portion of the top terminal 19 within the first region Wa is removed.

FIG. 5A to FIG. 5H are cross sections of a semiconductor structure during intermediate stages of manufacturing operations, in accordance with some embodiments of the present disclosure. Operations demonstrated in FIG. 5A to FIG. 5H are performed subsequent to the forming of the capacitor stack 1, e.g., FIG. 4A, FIG. 4B, FIG. 4C, or FIG. 4D. For the purpose of conciseness, herein the FIG. 5A to FIG. 5H illustrates the intermediate stages of fabricating the semiconductor structure 100A (shown in FIG. 1A), as the operations discussed herein can also be applied to the fabrication of semiconductor structures 100B, 100C, and 100D (shown in FIG. 1B, FIG. 1C, FIG. 1D respectively).

Figure 5A:
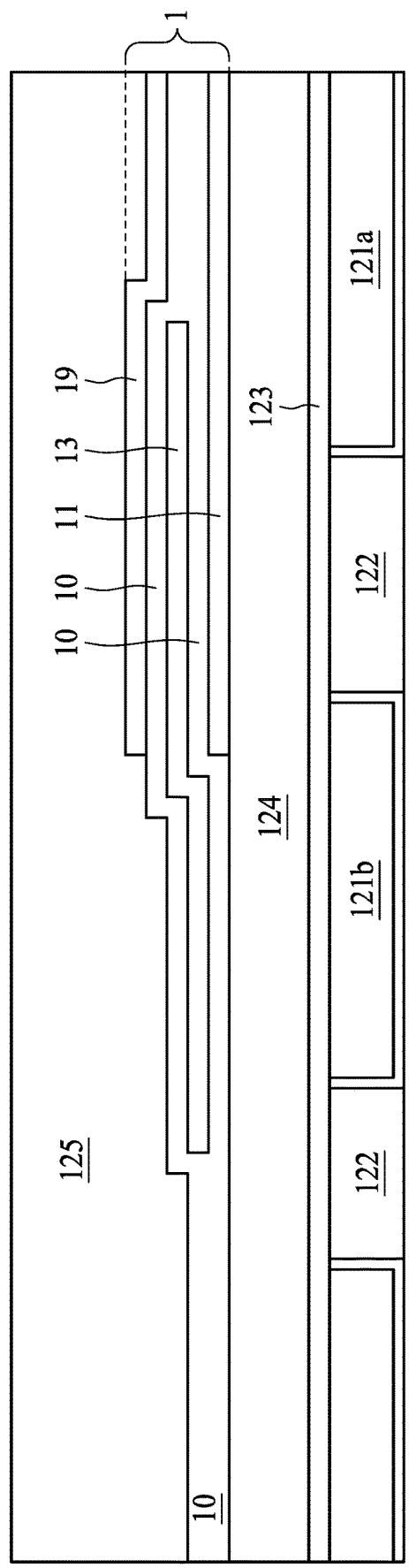
FIG. 5A to FIG. 5H are cross sectional views of semiconductor structures during an intermediate stage of its manufacturing process, according to some embodiments of present disclosure.
Figure 5B:
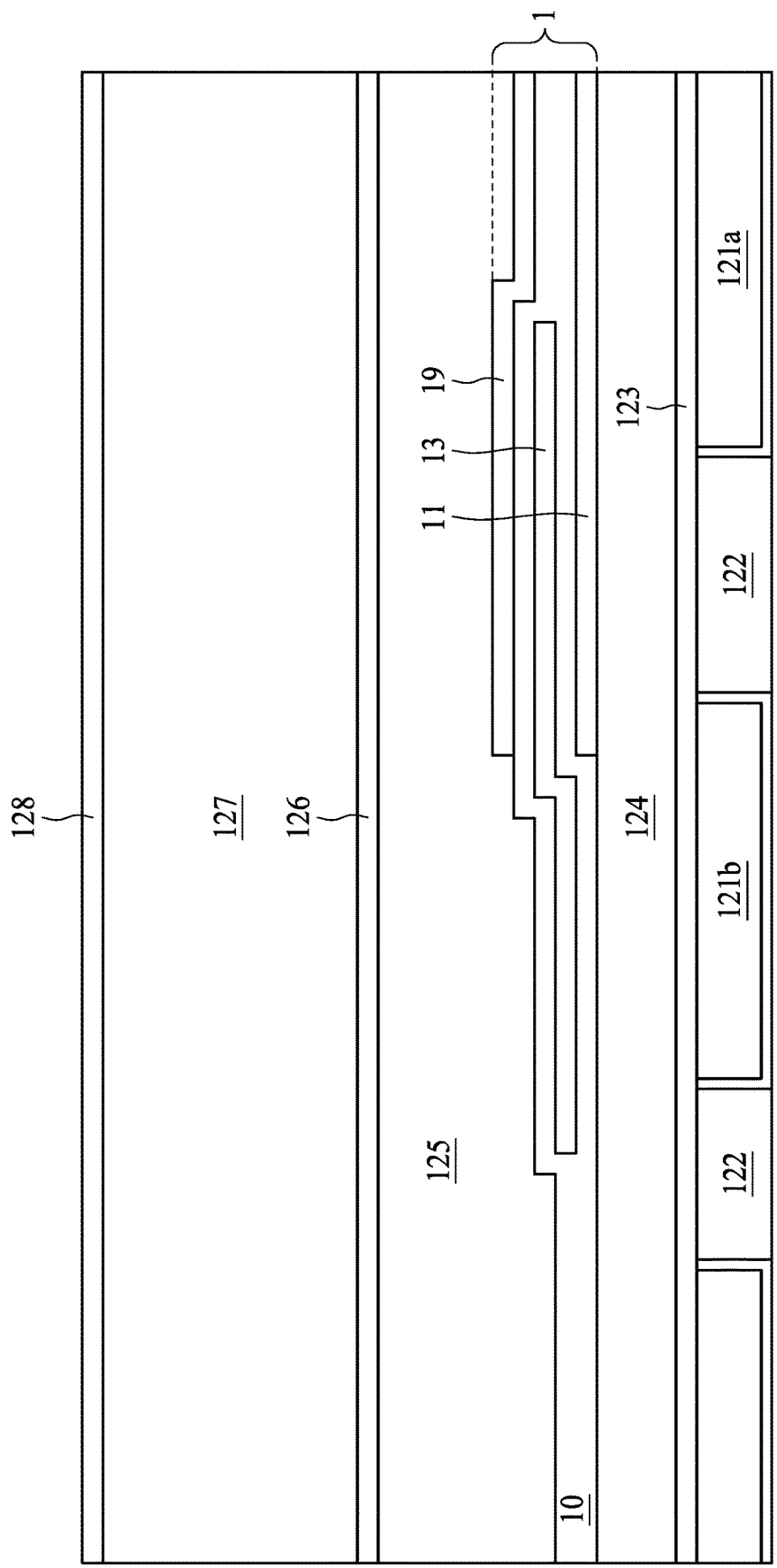

Referring to FIG. 5A, the second passivation layer 125 is formed above the capacitor stack 1 and exposed portion of the high-k dielectric layer 10. The second passivation layer 125 may be formed by a variety of techniques, e.g., spin-on coating, deposition, plasma enhanced deposition, or the like. Referring to FIG. 5B, the first etch stop layer 126 may be formed above the second passivation layer 125, and the third passivation layer 127 is formed above the first etch stop layer 126. The third passivation layer 127 may be formed by a variety of techniques, e.g., spin-on coating, deposition, plasma enhanced deposition, or the like. The second etch stop layer 128 is further formed above the third passivation layer 127.

Figure 5C:
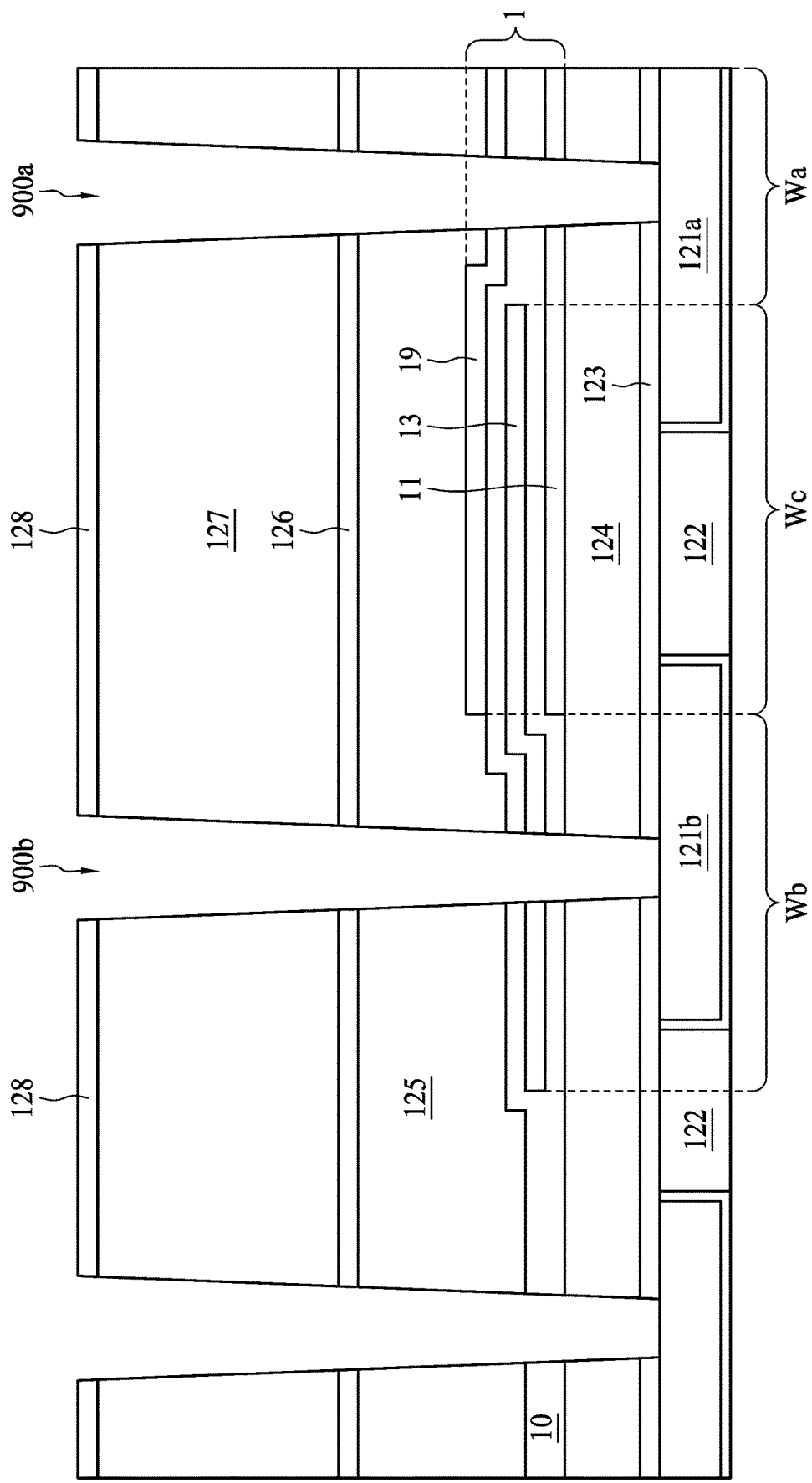

Referring to FIG. 5C, a first trench 900a and a second trench 900b are formed above the first metal line 121a and the second metal line 121b respectively, as the first trench 900a and a second trench 900b are recessed from the second etch stop layer 128 to the first metal line 121a and the second metal line 121b respectively. The first trench 900a and the second trench 900b taper toward the first metal line 121a and the second metal line 121b respectively. The first trench 900a and the second trench 900b can be formed by etch operation, as the end points of etching the first trench 900a and the second trench 900b are controlled by the bottom etch stop layer 123.

Figure 5D:
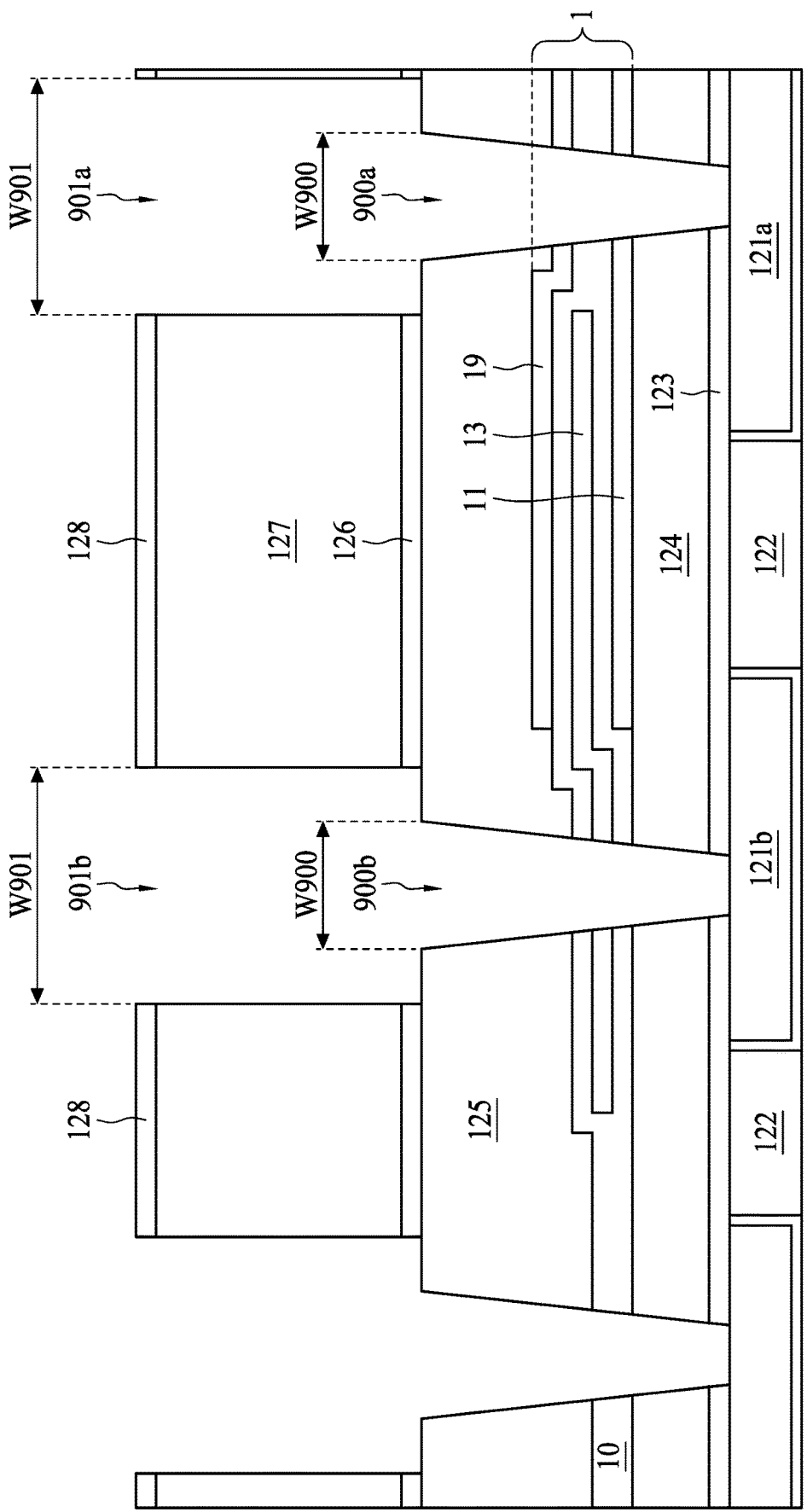

Referring to FIG. 5D, a third trench 901a and a fourth trench 901b are recessed from the second etch stop layer 128 by etch operation, and formed above the first trench 900a and the second trench 900b respectively. The third trench 901a and a fourth trench 901b may have substantially constant width W901. The width W901 of each of a bottom surface of the third trench 901a and the fourth trench 901b are greater than a width W900 of each of a top surface of the first trench 900a and the second trench 900b. The bottom surfaces of the third trench 901a and the fourth trench 901b may stop at the first etch stop layer 126.

Figure 5E:
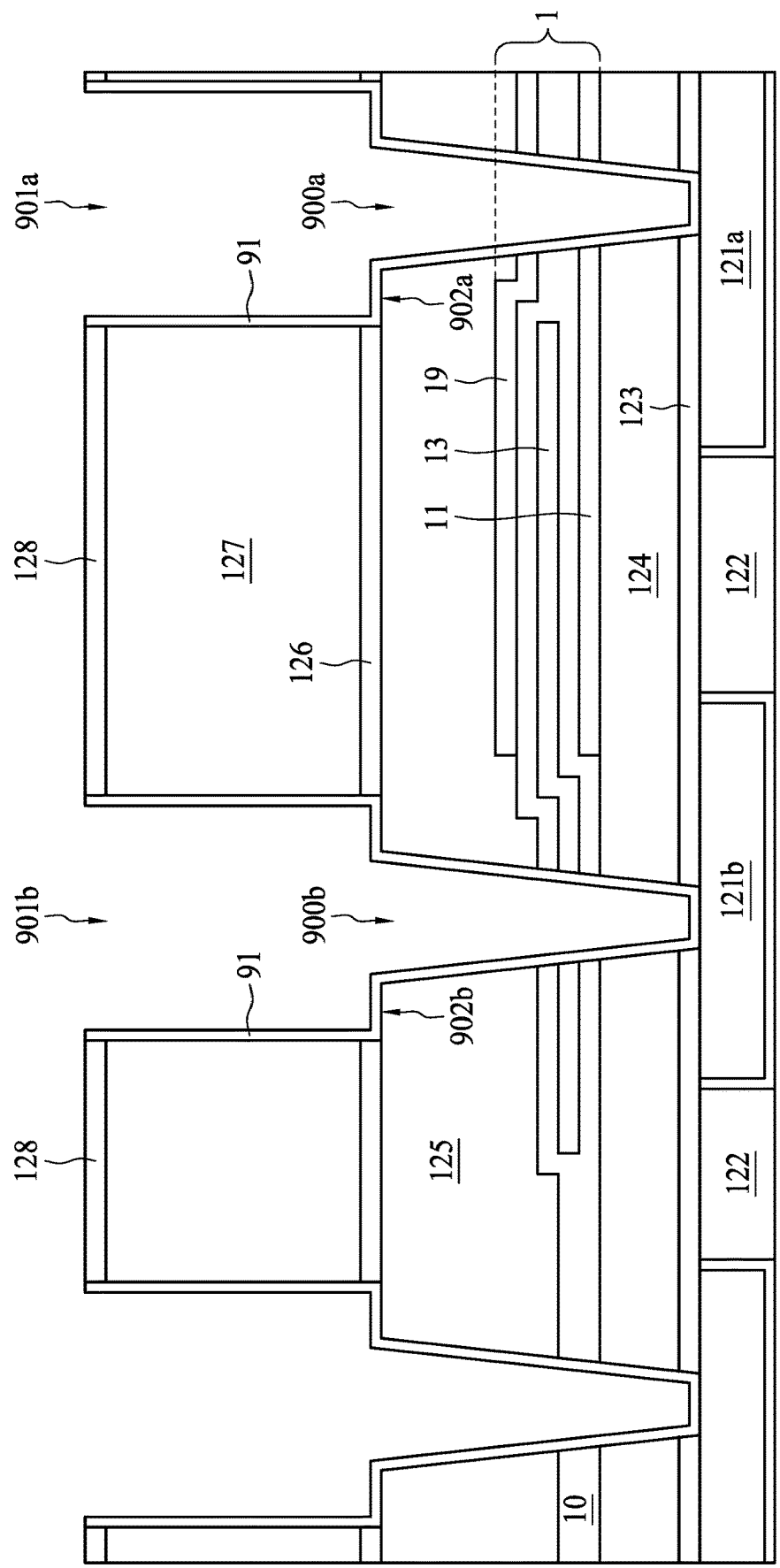

Referring to FIG. 5E, the seed layer 91 is formed conformably on a sidewall of the first trench 900a, a sidewall of the second trench 900b, a sidewall of the third trench 901a, and a sidewall of the fourth trench 901b. The seed layer 91 may further covers a bottom surface 902a of the third trench 901a, and a bottom surface 902b of the fourth trench 901b. In some embodiments, the seed layer 91 further formed at a bottom of the first trench 900a and a bottom of the second trench 900b.

Figure 5F:
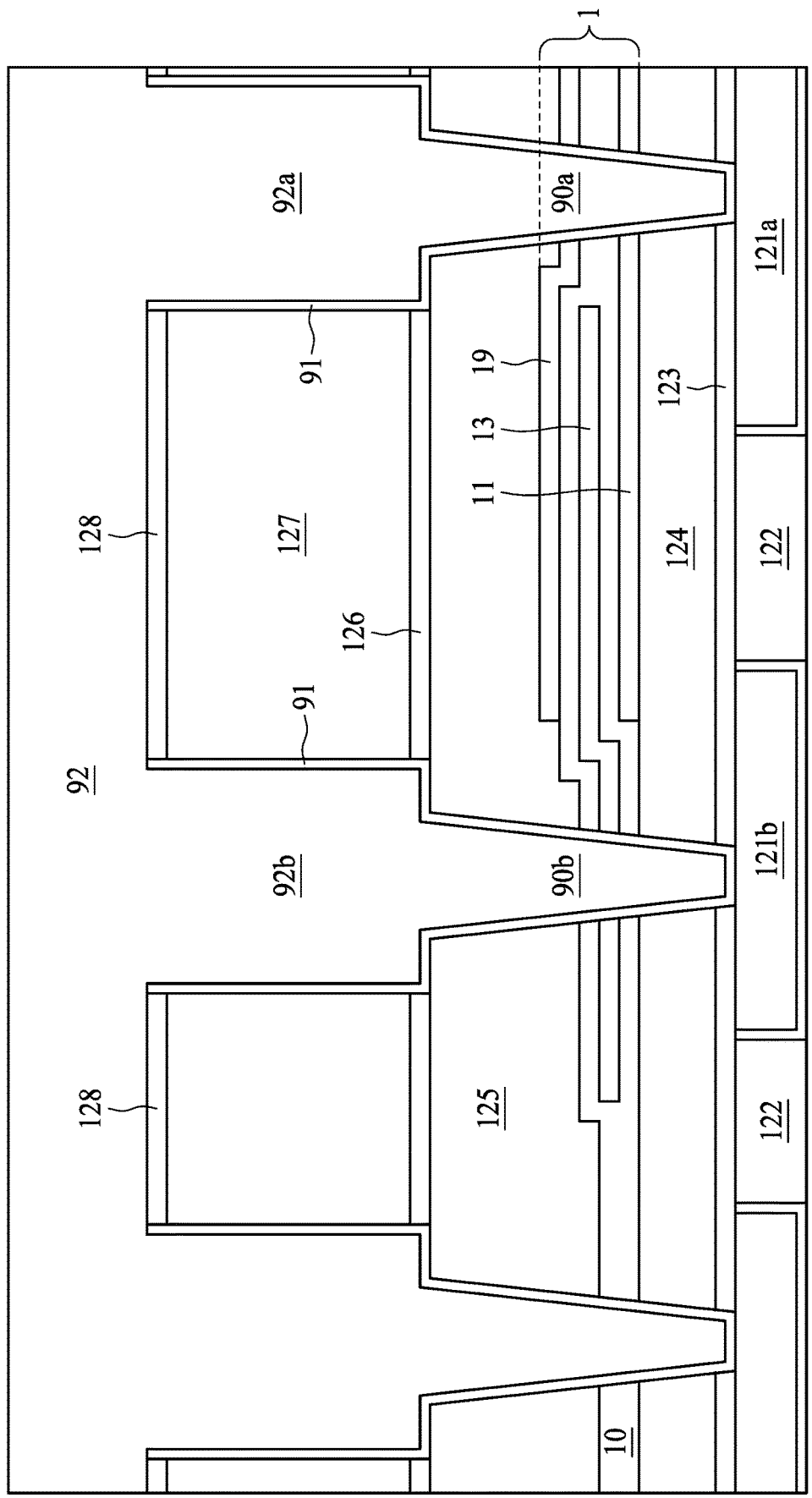
Figure 5G:
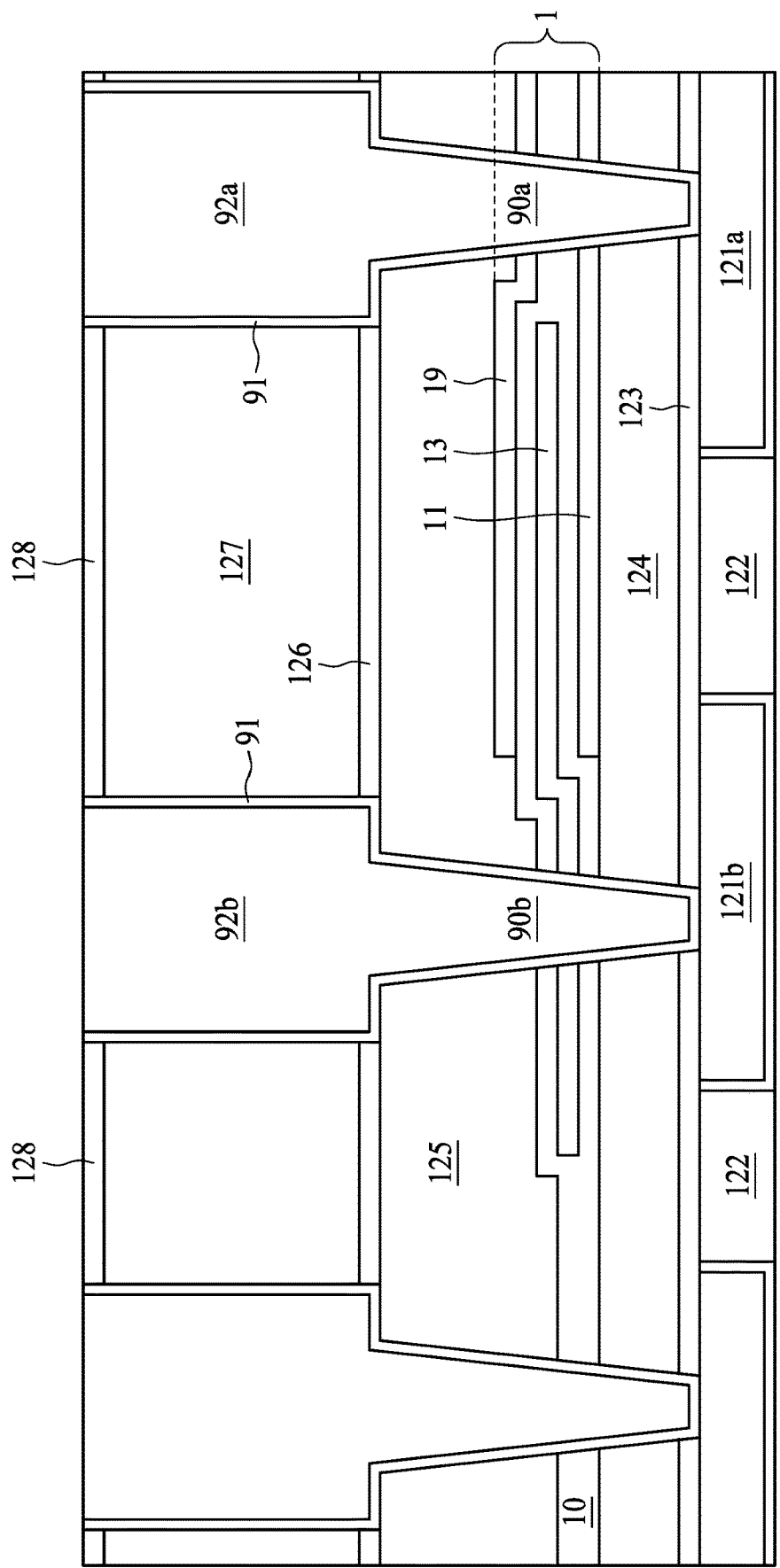

Referring to FIG. 5F, the conductive material 92 is formed in the first trench 900a, the second trench 900b, the third trench 901a, and the fourth trench 901b. Referring to FIG. 5G, a planarization operation is performed to remove the excessive conductive material 92 above the second etch stop layer 128, thereby the first conductive post 92a in the third trench 901a and the second conductive post 92b in the fourth trench 901b are formed. The conductive material 92 can formed by a variety of techniques, e.g., electro plating, electro-less plating, sputtering, deposition, physical vapor deposition (PVD), atomic layer deposition (ALD), or the like. In some embodiments, the conductive material 92 is cobalt. Cobalt is one of the conductive materials which can be filled in the high aspect ratio trenches with sufficient condensation; thence the induction of voids formed thereof may be reduced.

Figure 5H:
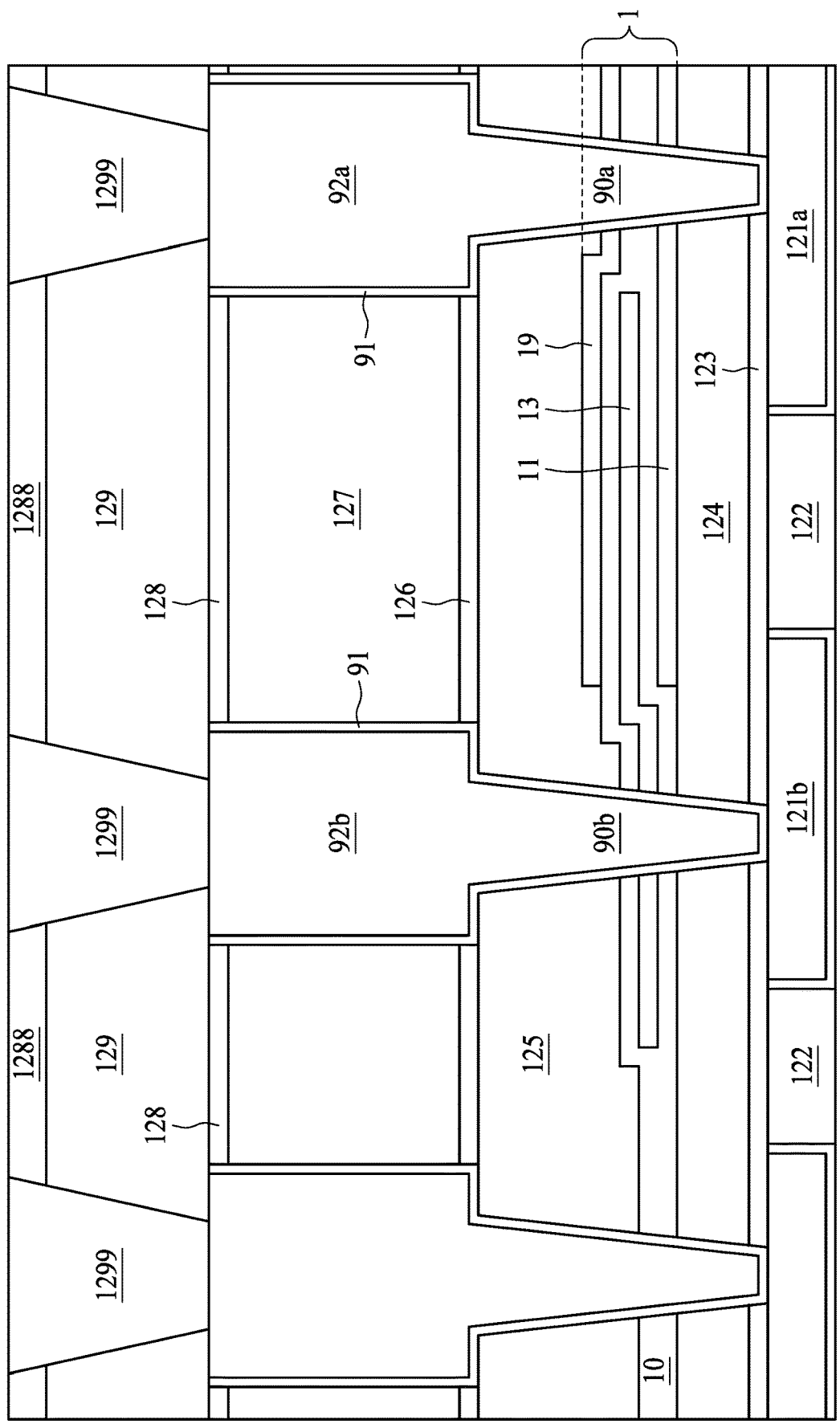

Referring to FIG. 5H, the fourth passivation layer 129 is formed above the second etch stop layer 128. The fourth passivation layer 129 may be formed by a variety of techniques, e.g., spin-on coating, deposition, plasma enhanced deposition, the combination thereof, or the like. In some embodiments, the fourth passivation layer 129 may include two layers, including a USG layer proximal to the fourth passivation layer 129 and a plasma enhanced deposited oxide layer distal to the fourth passivation layer 129. The third etch stop layer 1288 is disposed above the fourth passivation layer 129, and the metal contact 1299 is formed above and being electrically connected to each of the first conductive post 92a and the second conductive post 92b. A planarization operation is performed to remove excessive material of the metal contact 1299 above the third etch stop layer 1288.

FIG. 6A to FIG. 6F are cross sections of a semiconductor structure during intermediate stages of manufacturing operations, in accordance with some embodiments of the present disclosure. Operations demonstrated in FIG. 6A to FIG. 6F are performed subsequent to the forming of the capacitor stack 1, e.g., FIG. 4A, FIG. 4B, FIG. 4C, or FIG. 4D. For the purpose of conciseness, herein the FIG. 6A to FIG. 6F illustrates the intermediate stages of fabricating the semiconductor structure 200B (shown in FIG. 2B), as the operations discussed herein can also be applied to fabrication of the semiconductor structures 200A, 200C, and 200D (shown in FIG. 2A, FIG. 2C, FIG. 2D respectively).

Figure 6A:
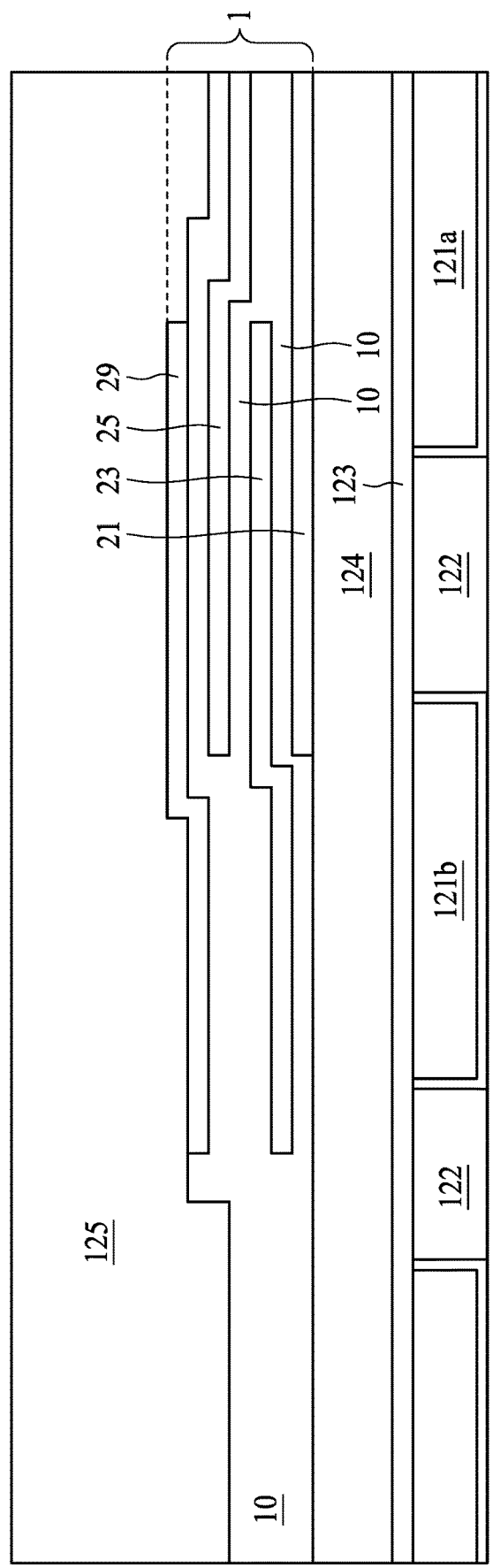
FIG. 6A to FIG. 6F are cross sectional views of semiconductor structures during an intermediate stage of its manufacturing process, according to some embodiments of present disclosure.

Referring to FIG. 6A, the second passivation layer 125 is formed above the capacitor stack 1 and exposed portion of the high-k dielectric layer 10. The second passivation layer 125 may be formed by a variety of techniques, e.g., spin-on coating, deposition, plasma enhanced deposition, or the like.

Figure 6B:
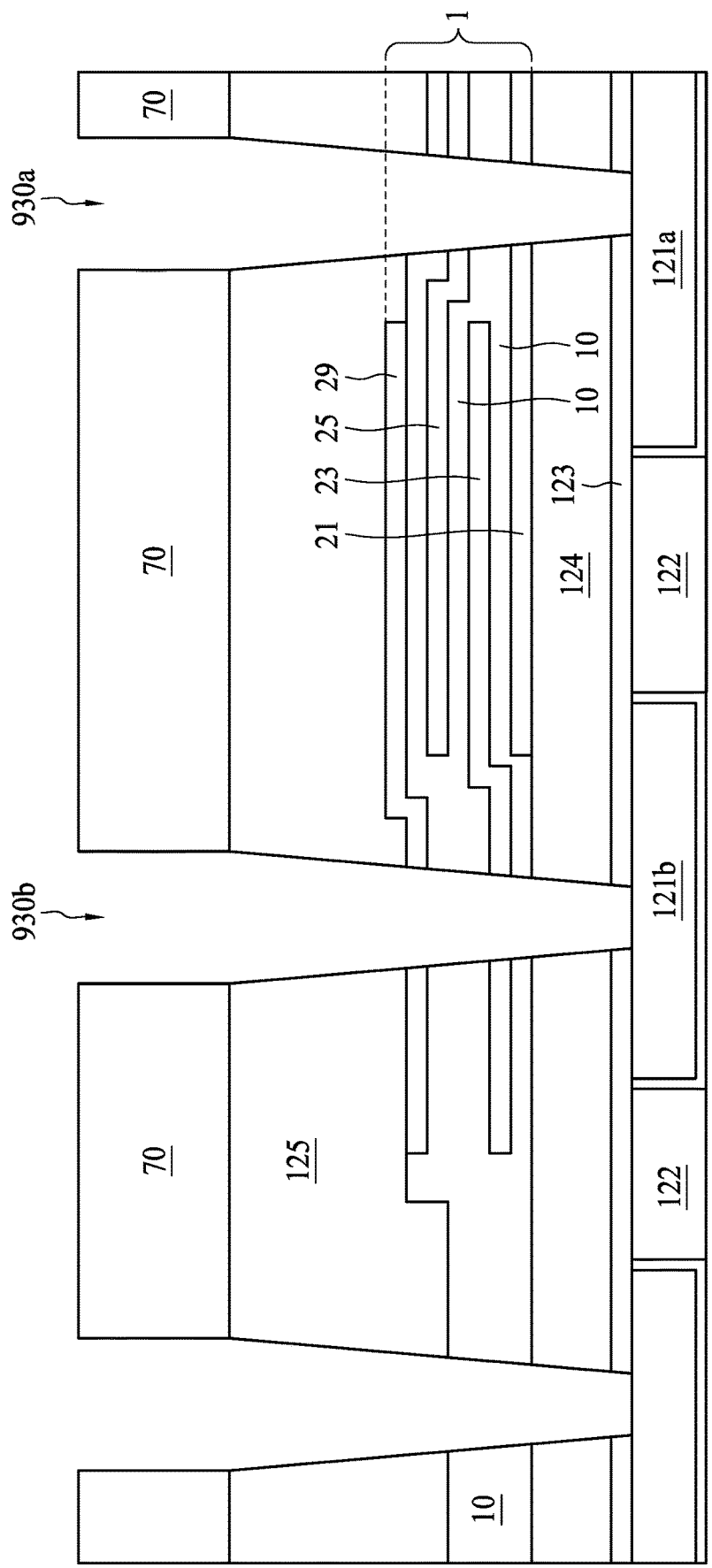

Referring to FIG. 6B, a photomask 70 is disposed above the second passivation layer 125. A first trench 930a and a second trench 930b are formed above the first metal line 121a and the second metal line 121b respectively, as the first trench 930a and the second trench 930b are recessed from a top surface of the second passivation layer 125 to first metal line 121a and the second metal line 121b respectively. The end points of etching the first trench 930a and the second trench 930b are controlled by the bottom etch stop layer 123. The photomask 70 is removed subsequently.

Figure 6C:
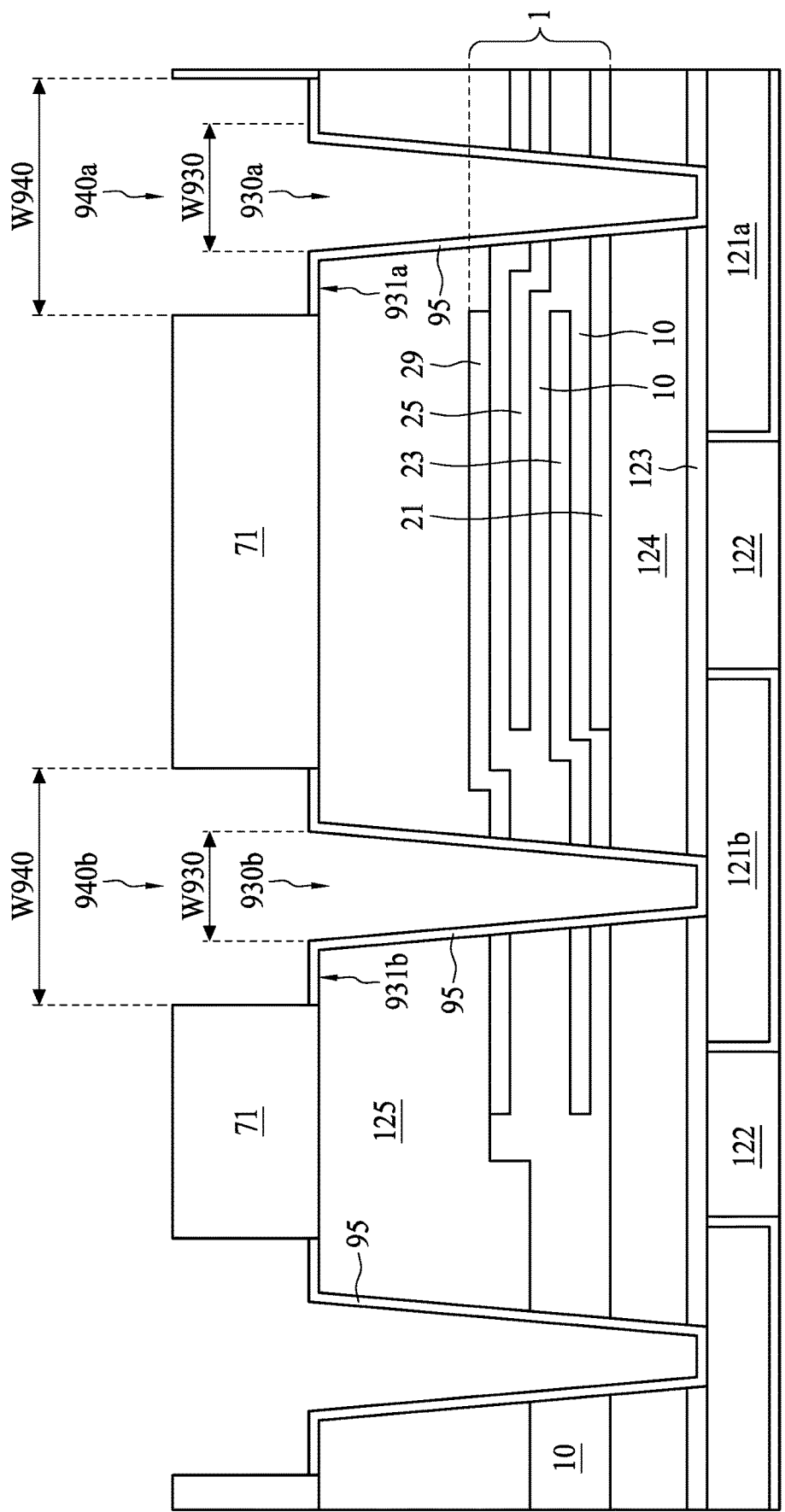

Referring to FIG. 6C, a dummy layer 71 is disposed above the second passivation layer 125. The dummy layer 71 is patterned for forming a third trench 940a and a fourth trench 940b, wherein the third trench 940a and the fourth trench 940b are above the first trench 900a and the second trench 900b respectively. A width W940 of the third trench 940a and the fourth trench 940b are greater than a width W930 of top surfaces of the first trench 930a and the second trench 930b. The first trench 900a and the second trench 900b can be formed by etch operation, as the end points of etching the first trench 900a and the second trench 900b are controlled by the bottom etch stop layer 123.

The adhesion layer 95 is formed conformably on a sidewall of the first trench 930a and a sidewall of the second trench 930b. The adhesion layer 95 may further covers a bottom surface 931a of the third trench 940a, and a bottom surface 931b of the fourth trench 940b. In some embodiments, the adhesion layer 95 further formed at a bottom of the first trench 930a and a bottom of the second trench 931b.

Figure 6D:
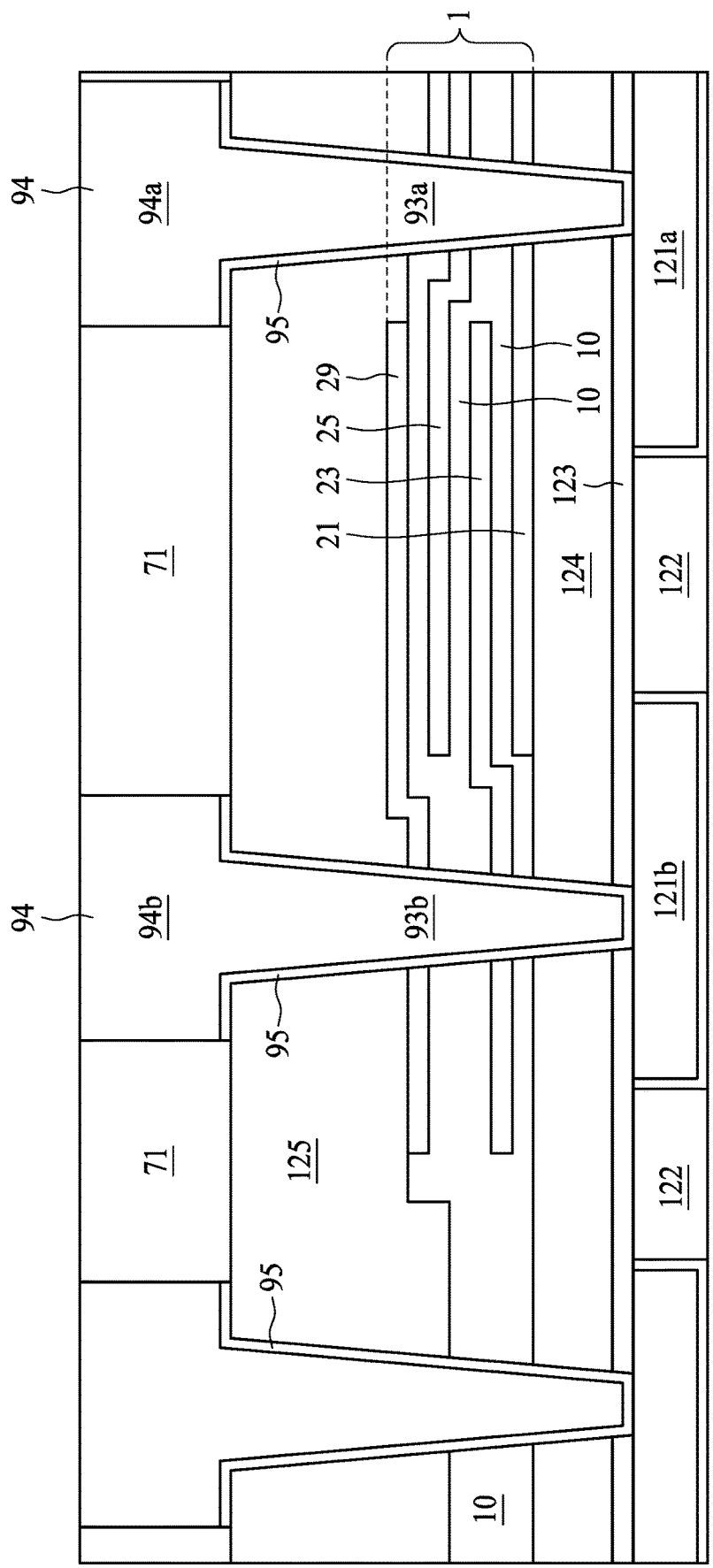

Referring to FIG. 6D, the conductive material 94 is formed inside first trench 930a, the second trench 930b, the third trench 940a, and the fourth trench 940b. The conductive material 94 can formed by a variety of techniques, e.g., electro plating, electro-less plating, sputtering, deposition, physical vapor deposition (PVD), atomic layer deposition (ALD), or the like. In some embodiments, the conductive material 94 is aluminum copper (AlCu). In some embodiments, a planarization operation is performed to remove the excessive conductive material 94 above a top surface of the dummy layer 71. The first conductive post 94a and the second conductive post 94b are formed above the second passivation layer 125 thereby. In some embodiments, when a thickness of the second via 93b is greater than 12,500 Angstroms and a thickness of the second conductive post 94b is greater than 28,000 Angstroms, key hole (not shown) can be formed during the deposition of the conductive material 94, for example, AlCu. In some embodiments, the thickness of the second via 93b is less than 12,500 Angstroms and the thickness of the second conductive post 94b is less than 28,000 Angstroms. If greater thickness is required, or alternatively, deeper trenches to be filled, conductive material 94 can be substituted from AlCu to cobalt.

Figure 6E:
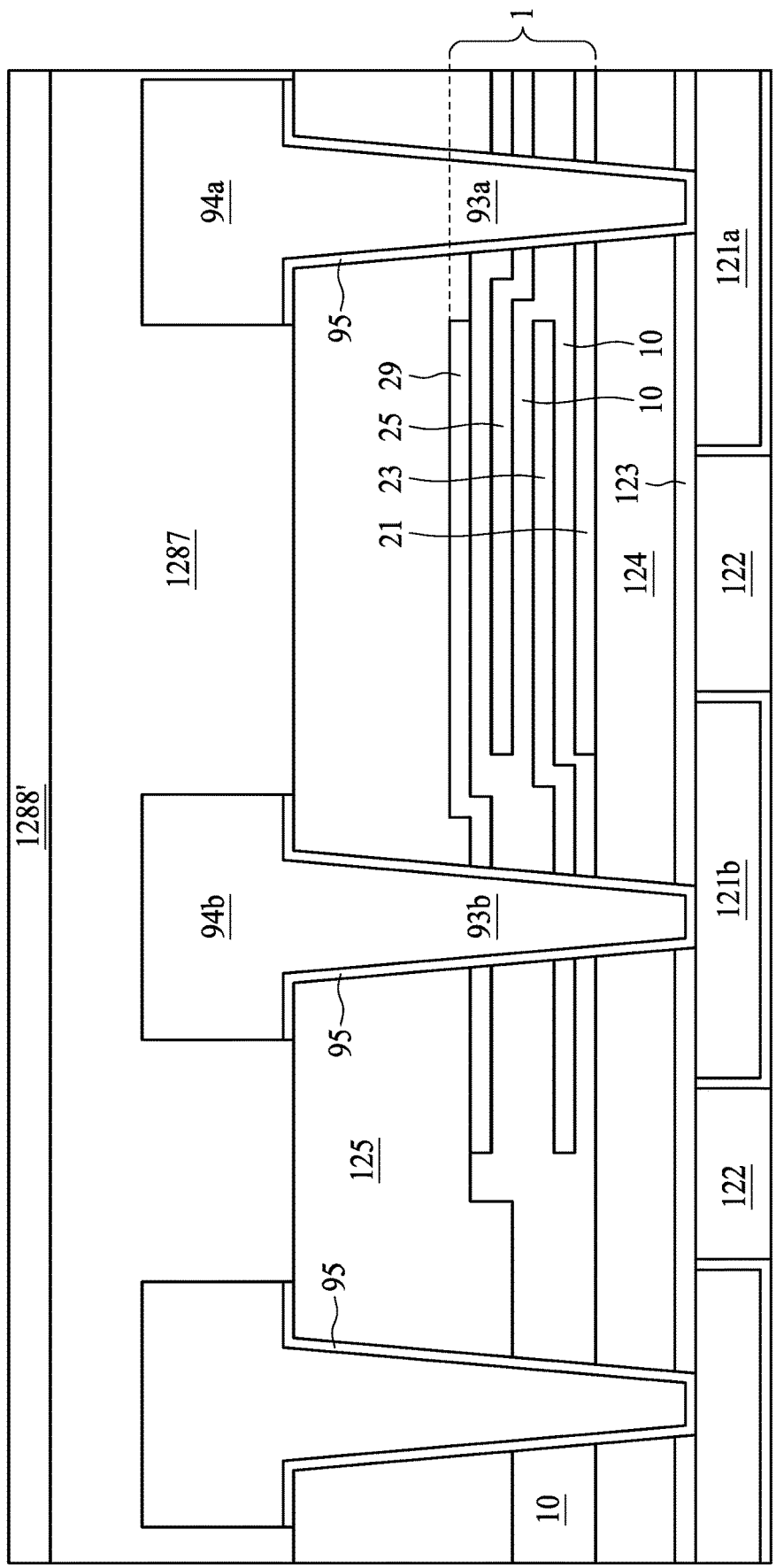

Referring to FIG. 6E, the dummy layer 71 is subsequently removed. The upper passivation layer 1287 is formed above the second passivation layer 125 and surrounding the first conductive post 94a and the second conductive post 94b. The upper passivation layer 1287 may be formed by a variety of techniques, e.g., spin-on coating, deposition, plasma enhanced deposition, or the like. The upper etch stop layer 1288' is formed above the upper passivation layer 1287.

Figure 6F:
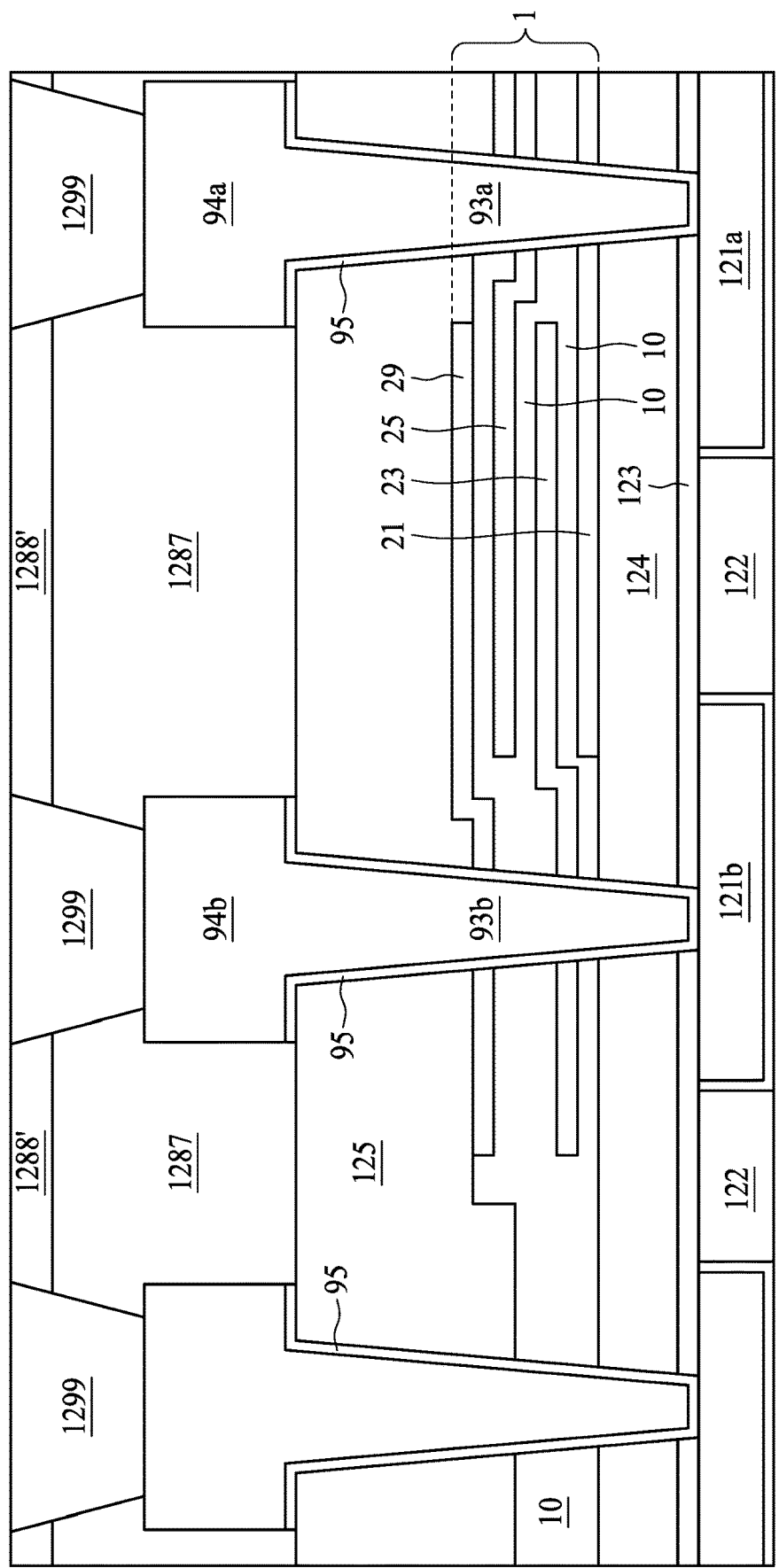

Referring to FIG. 6F, the metal contact 1299 is formed above and being electrically connected to each of the first conductive post 94a and the second conductive post 94b. A planarization operation is performed to remove excessive material of the metal contact 1299 above the upper etch stop layer 1288'.

Some embodiments of the present disclosure provide semiconductor structures with methods to enhance electric potential energy storage per unit area by increasing the layers of terminals in the capacitance. During the operations of fabricating the semiconductor structures, cobalt can be used as the conductive material to form in the vias to ameliorate the issues of void-induction. The induction of voids can also be mitigated by reducing the thickness of the first passivation layer between the capacitor stack and the metal line, or reducing the height of the vias.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a semiconductor structure, including a bottom terminal, a first middle terminal over the bottom terminal and separated from the bottom terminal by a high-k dielectric layer, a second middle terminal over the first middle terminal and separated from the first middle terminal by the high-k dielectric layer, a top terminal over the second middle terminal and separated from the second middle terminal by the high-k dielectric layer, a first via penetrating the bottom terminal and the second middle terminal, a second via penetrating the first middle terminal, a first passivation layer below the bottom terminal, and a second passivation layer over the top terminal.

Some embodiments of the present disclosure provide a semiconductor structure, including a bottom terminal, a first middle terminal over the bottom terminal and separated from the bottom terminal by a high-k dielectric layer, a top terminal over the first middle terminal and separated from the first middle terminal by the high-k dielectric layer, a first etch stop layer above the top terminal, a first via penetrating the bottom terminal, wherein the first via is filled with cobalt, and a second via penetrating the first middle terminal.

Some embodiments of the present disclosure provide a method for forming a semiconductor structure, including forming a bottom terminal, forming a first middle terminal over the bottom terminal, forming a top terminal over the first middle terminal, forming a high-k dielectric layer between the bottom terminal and the first middle terminal, and between the first middle terminal and the top terminal, and forming a first cobalt via penetrating the bottom terminal and the high-k dielectric layer.

What is claimed is:

1. A semiconductor structure, comprising:
   a bottom terminal;
   a first middle terminal over the bottom terminal and separated from the bottom terminal by a high-k dielectric layer;
   a second middle terminal over the first middle terminal and separated from the first middle terminal by the high-k dielectric layer;
   a top terminal over the second middle terminal and separated from the second middle terminal by the high-k dielectric layer;
   a first via penetrating the bottom terminal and the second middle terminal;
   a second via penetrating the first middle terminal;
   a first passivation layer below the bottom terminal;
   a second passivation layer over the top terminal;
   a conductive post over the first via; and
   a third passivation layer over the second passivation layer and laterally surrounding the conductive post, wherein a top surface of the third passivation layer is above a top surface of the conductive post.

2. The semiconductor structure of claim 1, further comprising at least one third middle terminal between the top terminal and the second middle terminal.

3. The semiconductor structure of claim 1, wherein the first via and the second via are filled with a conductive material.

4. The semiconductor structure of claim 3, wherein the conductive material comprises aluminum-copper.

5. The semiconductor structure of claim 1, wherein a thickness of the first passivation layer is in a range from about 2,700 Angstrom to about 3,300 Angstrom.

6. The semiconductor structure of claim 1, further comprising an etch stop layer above the second passivation layer.

7. The semiconductor structure of claim 1, further comprising a first metal line below the first passivation layer.

8. A semiconductor structure, comprising:
   a bottom terminal;
   a first middle terminal over the bottom terminal and separated from the bottom terminal by a high-k dielectric layer;
   a top terminal over the first middle terminal and separated from the first middle terminal by the high-k dielectric layer;
   a first etch stop layer above the top terminal;
   a passivation layer between the top terminal and the first etch stop layer;
   a second etch stop layer above the first etch stop layer;
   a dielectric layer between the first etch stop layer and the second etch stop layer;
   a first via penetrating the bottom terminal, wherein the first via is filled with cobalt;
   a cobalt post over the first via;
   a seed layer spacing between the dielectric layer and a sidewall of the cobalt post, wherein the seed layer is in direct contact with a first portion of a top surface of the passivation layer free from being under a coverage of a vertical projection area of the second etch stop layer; and
   a second via penetrating the first middle terminal.

9. The semiconductor structure of claim 8, further comprising at least one second middle terminal between the first middle terminal and the top terminal.

10. The semiconductor structure of claim 8, wherein the dielectric layer comprises oxides.

11. The semiconductor structure of claim 8, further comprising a copper line under the bottom terminal.

12. The semiconductor structure of claim 11, further comprising an undoped silicate glass (USG) layer between the copper line and the bottom terminal.

13. The semiconductor structure of claim 8, wherein the first portion of the top surface of the passivation layer overlaps with the first middle terminal.

14. A semiconductor structure, comprising:
   a bottom terminal;
   a first middle terminal over the bottom terminal;
   a top terminal over the first middle terminal;
   a first passivation layer over the top terminal;
   a second passivation layer above the first passivation layer;
   a high-k dielectric layer between the bottom terminal and the first middle terminal, and between the first middle terminal and the top terminal;
   a first via penetrating the bottom terminal and the high-k dielectric layer; and
   a conductive post surrounded by the second passivation layer and above the first via, wherein a top surface of the second passivation layer is above a top surface of the conductive post.

15. The semiconductor structure of claim 14, further comprising a second middle terminal between the top terminal and the first middle terminal.

16. The semiconductor structure of claim 14, further comprising a second via penetrating the first middle terminal.

17. The semiconductor structure of claim 14, further comprising:
   a third passivation layer below the bottom terminal; and a second etch stop layer above the second passivation layer.

18. The semiconductor structure of claim 17, wherein the third passivation layer comprises one of the undoped silicate glass or plasma enhanced deposited oxide (PEOX).

19. The semiconductor structure of claim 14, wherein a width of the conductive post is greater than a width of the first via.

20. The semiconductor structure of claim 14, wherein the high-k dielectric layer comprises a tri-layer of zirconium oxide-aluminum oxide-zirconium oxide.

* * * * *